US006912702B1

United States Patent
Iyer et al.

(10) Patent No.: US 6,912,702 B1
(45) Date of Patent: Jun. 28, 2005

(54) NON-LINEAR, GAIN-BASED MODELING OF CIRCUIT DELAY FOR AN ELECTRONIC DESIGN AUTOMATION SYSTEM

(75) Inventors: Mahesh Iyer, Sunnyvale, CA (US); Ashish Kapoor, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 498 days.

(21) Appl. No.: 10/191,745

(22) Filed: Jul. 8, 2002

Related U.S. Application Data

(63) Continuation of application No. 09/452,056, filed on Nov. 30, 1999, now Pat. No. 6,543,036.

(51) Int. Cl.[7] .............................................. G06F 17/50
(52) U.S. Cl. ............................. 716/6; 717/140; 716/2; 716/12; 716/17
(58) Field of Search ........................... 716/2, 6, 12, 17; 717/140

(56) References Cited

U.S. PATENT DOCUMENTS

| | | | |
|---|---|---|---|
| 5,524,244 A | * | 6/1996 | Robinson et al. ............ 717/140 |
| 5,726,902 A | | 3/1998 | Mahmood et al. |
| 6,345,379 B1 | | 2/2002 | Khouja et al. |
| 6,546,541 B1 | | 4/2003 | Petranovic et al. |

* cited by examiner

Primary Examiner—Thuan Do
(74) Attorney, Agent, or Firm—Beyer, Hoffman & Harms, LLP; Jeanette S. Harms

(57) ABSTRACT

A non-linear, gain-based modeling of circuit delay within an electronic design automation system. The present invention provides a scalable cell model for use in early logic structuring and mapping for the design of integrated circuits. The scalable cell model includes a four dimensional delay model accepting input slew and gain and providing delay and output slew. By eliminating output loading as a requirement for delay computations, the scalable model of the present invention can effectively be used to provide accurate delay information for early logic synthesis processes, e.g., that precede technology dependent optimizations where the actual load of a cell is unknown. This scalable cell model considers: the impact of transition times on delay; complex gates having different input capacitances for different input pins; the impact of limited discrete cell sizes in the technology library; and design rules, e.g., maximum capacitance and maximum transition associated with gates. A technology library is analyzed and clustering is performed to select a cluster of cells for each cell group of a common functionality. A nominal input slew value is computed for all cells and a scaling factor is computed for each cell of each cluster. From each cluster, a four dimensional gain-based non-linear scalable cell model (look-up table) is generated. A default gain is computed for each scalable cell model and an area model and an input pin capacitance model are generated for each scalable cell model.

24 Claims, 22 Drawing Sheets

| CELL FUNCTIONALITY | CELL IDs OF CELL GROUP | |
|---|---|---|
| AND | 11, 13, 15, 17, 18, 21 | 282 |
| OR | 25, 27, 29, 31, 33, 35, 37 | 284 |
| INVERTER | 41, 43, 45, 47, 49, 51, 53 | 286 |
| MUX | 55, 57, 59, 61, 63, 65, 67 | 288 |

| CELL FUNCTIONALITY | CELL IDs OF CELL GROUP |
|---|---|
| AND | 13, 15, 17, 18 <u>292</u> |
| OR | 29, 31, 33, 35, 37 <u>294</u> |
| INVERTER | 41, 43, 45, 47, 49 <u>296</u> |
| MUX | 55, 57, 59, 61 <u>298</u> |

NON-LINEAR, GAIN-BASED MODELING OF CIRCUIT DELAY FOR AN ELECTRONIC DESIGN AUTOMATION SYSTEM

This is a continuation of application Ser. No. 09/452,056 filed on Nov. 30, 1929, now U.S. Pat. No. 6,543,036, which is hereby incorporated by reference.

BACKGROUND OF THE INVENTION

1. Field of the Invention

The present invention relates to the field of electronic design automation systems for designing and characterizing integrated circuits. More specifically, the present invention relates to an effective modeling method and data structure for modeling signal propagation delay of a timing arc of an integrated circuit cell.

2. Related Art

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated by the EDA system into a lower level technology-specific netlist based on a technology-specific library that has gate-specific models for timing and power estimation. A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and processed and verified using many well known techniques. One result is a physical device layout in mask form which can be used to directly implement structures in silicon to realize the physical IC device.

More specifically, within a typical EDA system, the circuit designer first produces a high-level description of the circuit in a hardware description language such as Verilog or VHDL. This high-level description is converted into a netlist using a computer implemented synthesis process such as the "Design Compiler" by Synopsys of Mountain View, Calif. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. Determining this geometric information is the function of a computer controlled placement process and a computer controlled routing process.

The placement process finds a location for each cell on a circuit board or silicon chip. The locations are specified, typically, in two dimensional spatial coordinates, e.g., (x, y) coordinates, on the circuit board or silicon chip. The locations are typically selected to optimize certain objectives such as wire length, wire routibility, circuit speed, circuit power consumption, and/or other criteria, subject to the condition that the cells are spread evenly over the circuit board or silicon chip and that the cells do not overlap with each other. The output of the automatic computer controlled cell placement process includes a data structure including the (x, y) location for each cell of the IC design.

Next, the designer supplies the netlist and the cell location data structure, generated by the placement program, to a computer implemented automatic wire routing process ("router"). The router generates wire geometry within data structure for connecting pins together. The wire geometry data structure and cell placement data structure together are used to make the final geometric database needed for fabrication of the circuit. Routers typically include a coarse routing process and a fine routing process. The coarse router provides a general path for the routing that is done at the detail stage. The coarse router examines at the level of the whole integrated circuit chip and its available resources and determines what the rough pathways should be from a topological standpoint. The fine or detail router lays down the actual geometries and connected wire segments in the appropriate layers as a wire connection may span multiple layers. The fine router creates wire routes that are "clean," e.g., do not have design rule violations, do not overlap other structures and can be fabricated.

The signal propagation delay ("cell delay") through a cell ("gate") is an important characteristic to model within an EDA system. The cell delays in a technology library are typically represented using non-linear delay models (NLDM) which are essentially look-up tables. Typically, a group of tables are supplied in the technology library for each cell, tables are designated for representing the rise and fall delays for each timing arc of the cell. These tables are typically 4-dimesional in that they accept output load and input transition time (slew) as inputs and generate delay and output slew values as outputs. These output load-based NLDMs, while providing delay values, have a disadvantage in the cell delay modeling processes that are performed early in the circuit synthesis process. For instance, during early circuit synthesis processes, the output load of the cell is not known because the cells have not yet been mapped to the target technology library and, as such, the cells are not yet connected together. Output load estimates are made in these early synthesis processes because the output load-based NLDMs need these values as inputs. Unfortunately, the output load estimates introduce inaccuracies in the overall circuit synthesis process. The output load-based NLDMs also introduce a "Catch-22" problem in that delay modeling helps to accurately map the cells, but mapping yields the true output capacitance that is then used to accurately determine the cell's delay, etc. It would be advantageous to provide a cell delay modeling system that did not require the output load of a cell as an input.

A more simplistic linear delay model has been proposed as a vehicle for efficient logic synthesis of high-performance designs. This delay model is also referred to as the constant delay model. In the constant delay model, the delay of a timing arc of a gate, $\tau$, is represented as:

$$\tau = R \cdot C_o + p$$

where
R=output resistance,
$C_o$=output load of the timing arc output, and
p=intrinsic delay of a gate.

This relationship can also be represented as:

$$\tau = (R \cdot C_i) \cdot (C_o/C_i) + p$$

where $C_i$ = input capacitance of the timing arc input.

The term $(R \cdot C_i)$ is also referred to as the logical effort of the gate. The term $(C_o/C_i)$ is also referred to as the electrical effort or gain of the gate.

The constant delay model assumes that the delay of the timing arc remains constant. The reasoning for this is as follows. The intrinsic delay of the gate, p, is constant. As $C_o$ increases, the gate is implicitly upsized, so $C_i$ increases appropriately. So, $(C_o/C_i)$ remains constant. As $C_i$ increases, R appropriately decreases, so $(R \cdot C_i)$ remains constant. Consequently, $\tau$ remains constant. An important property of the constant delay model is that the delay of a timing arc is independent of load, e.g., the delay does not depend on either $C_o$ or $C_i$, but merely on the ratio of the two. This property is useful in early stages of logic synthesis, prior to technology dependent optimization because the actual load of a gate is unknown at that time.

However, while this simplistic delay model does have its advantages, the constant delay model does not consider several important factors when modeling the delay of a gate. For instance, the constant delay model does not consider the impact of transition times on delay, nor does it deal effectively with complex gates with different input capacitances for different input pins. The model also fails to take into consideration the impact of limited discrete sizes in the technology library nor of certain design rules like maximum capacitance and maximum transition associated with gates. By not taking into consideration the above factors, the constant delay model is not as accurate as non-linear delay models. It would be advantageous to provide a method and system for providing cell delay modeling that offered the advantageous of constant cell delay modeling but also considered the above referenced factors.

SUMMARY OF THE INVENTION

Accordingly, the present invention provides a cell delay modeling system and method for modeling cell delay without requiring the output load capacitance of the cell as an input. Furthermore, the present invention provides a non-linear delay model for accurate cell delay modeling. The present invention provides a cell delay modeling system and method that considers the impact of transition times on delay, that deals effectively with complex gates with different input capacitances for different input pins, that takes into consideration the impact of limited discrete sizes in the technology library and furthermore takes into consideration certain design rules like maximum capacitance and maximum transition associated with gates. These and other advantages of the present invention not specifically mentioned above will become clear within discussions of the present invention presented herein.

A non-linear, gain-based modeling of circuit delay within an electronic design automation (EDA) system is described herein. The present invention provides a scalable cell model for use in logic structuring and mapping for the design of integrated circuits. The scalable cell model provides a four dimensional non-linear delay model that accepts (1) input slew and (2) gain and provides (3) delay and (4) output slew information for a scalable cell. By eliminating output loading as a requirement for delay computations, the scalable model of the present invention can effectively be used to provide accurate delay (timing) information for those logic synthesis processes that precede technology dependent optimizations where the actual load of a cell is unknown. This scalable cell model considers: the impact of transition times on delay; complex gates having different input capacitances for different input pins; the impact of limited discrete cell sizes in the technology library; and design rules, e.g., maximum capacitance and maximum transition associated with gates.

A library analysis process creates a scalable technology library by analyzing discrete cells from a target technology library. The target technology library is analyzed and clustering is performed to select a cluster (e.g., subset) of cells for each cell group sharing a common functionality. Clustering is performed based on a cluster metric that can be any of the following: a delay consistency metric, an input pin consistency metric, an intercept/slope consistency metric or a consistency metric based on the slope and average input capacitance being inversely proportional. A nominal input slew value is computed for all cells and a scaling factor is also computed for each cell of each cell cluster. From each cell cluster, a four dimensional scalable cell model (look-up table) is then generated that inputs gain and input slew and outputs delay and output slew. Separate non-linear delay models are provided for rise and fall time for each cell. Those cells not within a cell cluster do not participate in generating data for the scalable model. Therefore, the scalable cells in the scalable library are characterized with a new load-independent delay model, in which delay is modeled as a non-linear function of gain and slew.

A default gain is then computed for each scalable cell model and an area model and an input pin capacitance model are then generated for each scalable cell model. The input pin capacitance model is useful for load propagation of the scalable cells. For a particular integrated circuit design, its designated discrete cells are replaced with the scalable cells which are used during logic structuring and technology mapping. Logic structuring and mapping processes use the scalable cells as a basis for the optimization. After synthesis, a discretization process then converts the scalable cells back to discrete cells before the technology dependent optimizations are performed. Therefore, at the end of optimization, present invention discretizes the scalable cells to the closest discrete cells available in the target technology library. Following this, technology dependent optimization is performed primarily for delay, design rule fixing and area recovery. The accuracy of the logic structuring and mapping processes is hinged upon the accuracy of the scalable model that library analysis derives.

The present invention also has a capability of automatically determining whether a technology library is suitable for its optimization techniques. This is important because the accuracy of many processes in the present invention may depend on the accuracy of the gain-based scalable delay model that is created. After performing library analysis, a library evaluation step is performed to determine if the target technology library is suitable. If the library is found to be suitable, logic structuring and mapping is invoked and if not, a conventional optimization engine can be used.

Specifically, embodiments of the present invention include a data structure model stored in computer readable memory, the data structure model comprising: a look-up table storing values referenced by gain and input slew, the look-up table providing an output slew value and an output delay value for a given pair of input values comprising: a gain value; and an input slew value, wherein the look-up table is used by computer implemented electronic design automation processes for providing an estimate of a signal delay through an integrated circuit cell, the estimate of the signal delay being used in designing an integrated circuit device including said cell wherein the look-up table models signal delay using a non-linear function.

Embodiments of the present invention also include a method of generating a scalable cell model for an integrated circuit cell comprising the steps of: a) accessing a technology library comprising a plurality of cell groups each cell group comprising a plurality of discrete cells that share a common logic function but are of different cell sizes, each discrete cell having a corresponding output load-based non-linear delay model; b) generating a metric for a selected cell group that measures a cell characteristic over all discrete cells of the selected cell group; c) generating, based on the metric, a cell cluster for the selected cell group by selecting a subset of discrete cells of the selected cell group that are similar in terms of the cell characteristic; d) generating a gain-based delay model for the scalable cell based on output load-based non-linear delay models of the discrete cells of the cell cluster, the gain-based delay model receiving an input gain value and providing, based thereon, an output delay value; and e) storing the gain-based delay model within a computer memory.

BRIEF DESCRIPTION OF THE DRAWINGS

FIG. 6A illustrates several cell groups within an input technology library, each cell group containing discrete cells of a same logic function.

FIG. 6B illustrates cell clusters of discrete cells, a cell cluster being defined for each cell group identified in FIG. 6A in accordance with an embodiment of the present invention.

DETAILED DESCRIPTION OF THE INVENTION

Figure 1:
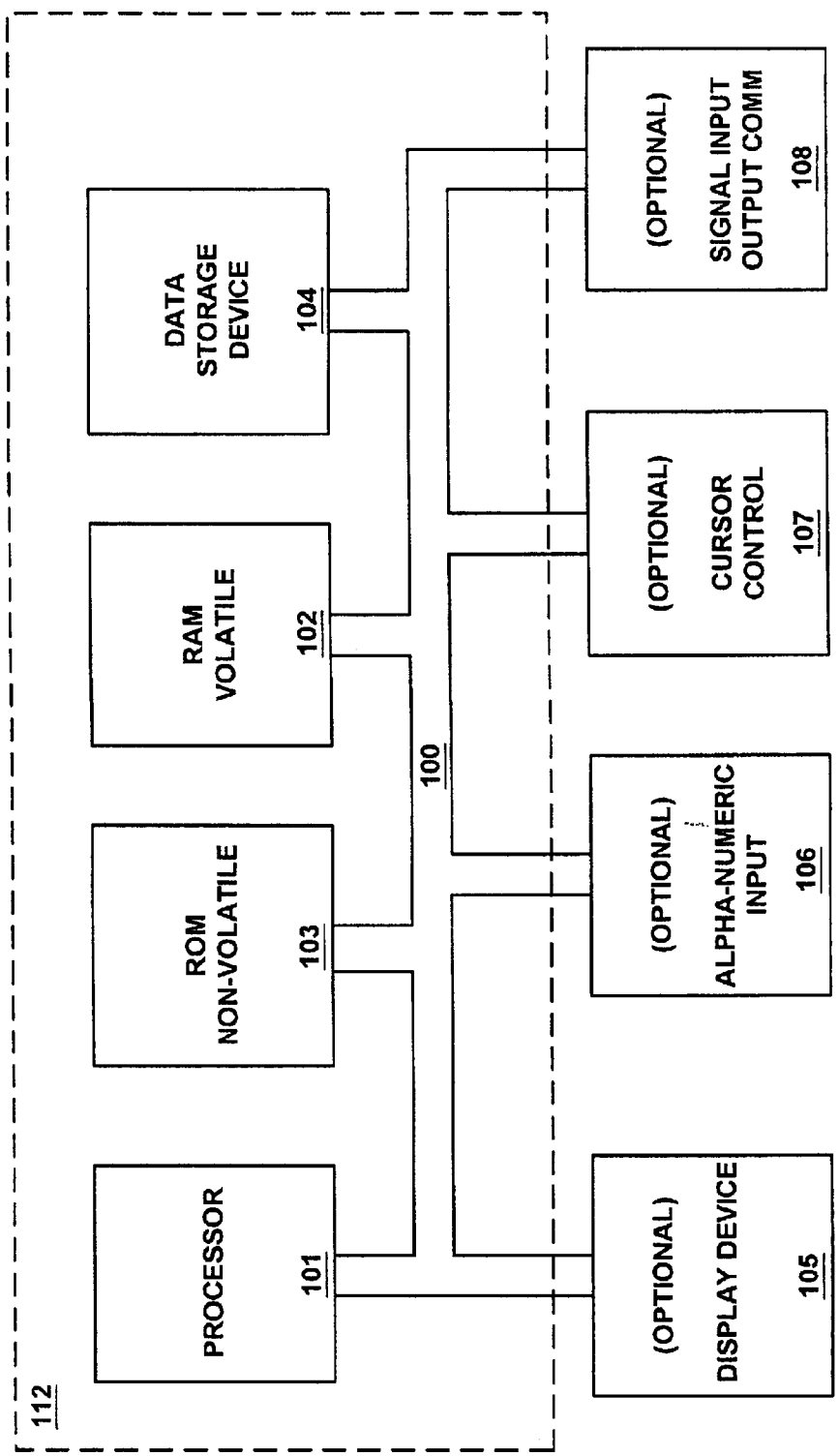
FIG. 1 is a block diagram of a general purpose computer system operable as a platform for the embodiments of the modeling processes and data structures of the present invention.

In the following detailed description of the present invention, a non-linear, gain-based modeling of delay using a scalable cell model, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Cases Incorporated by Reference

The following United States co-pending patent applications are incorporated herein by reference: 1) application entitled, "Evaluation of a Technology Library for Use in an Electronic Design Automation System that Converts the Technology Library into Non-Linear, Gain-Based Models for Estimating Circuit Delay," by M. Iyer and A. Kapoor, Ser. No. 09/451,467, filed Nov. 30, 1999, and assigned to the assignee of the present invention; and 2) application entitled, "Construction of a Technology Library for Use in an Electronic Design Automation System that Converts the Technology Library into Non-Linear, Gain-Based Models for Estimating Circuit Delay," by M. Iyer and A. Kapoor, Ser. No. 09/452,366, filed Nov. 30, 1999, and assigned to the assignee of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on an EDA computer system (e.g., processes 200, 222, 266, 268, 270, 272 and 228). These steps are implemented as program code stored in computer readable memory units of a computer system and are executed by the processor of the computer system. Although a variety of different computer systems can be used with the present invention, an exemplary general purpose computer system 112 is shown in FIG. 1.

In general, computer system 112 of FIG. 1 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of computer system 112 include 102, 103 and 104 and can be used to store data structures describing gain-based non-linear delay models in accordance with the present invention.

Also included in computer system 112 of FIG. 1 is an alphanumeric input device 106 including alphanumeric and function keys coupled to the bus 100 for communicating information and command selections to the central processor 101. Computer system 112 also includes an optional cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters on a display screen and recognizable to the user.

Non-Linear Gain-Based Delay Modeling

Figure 2:
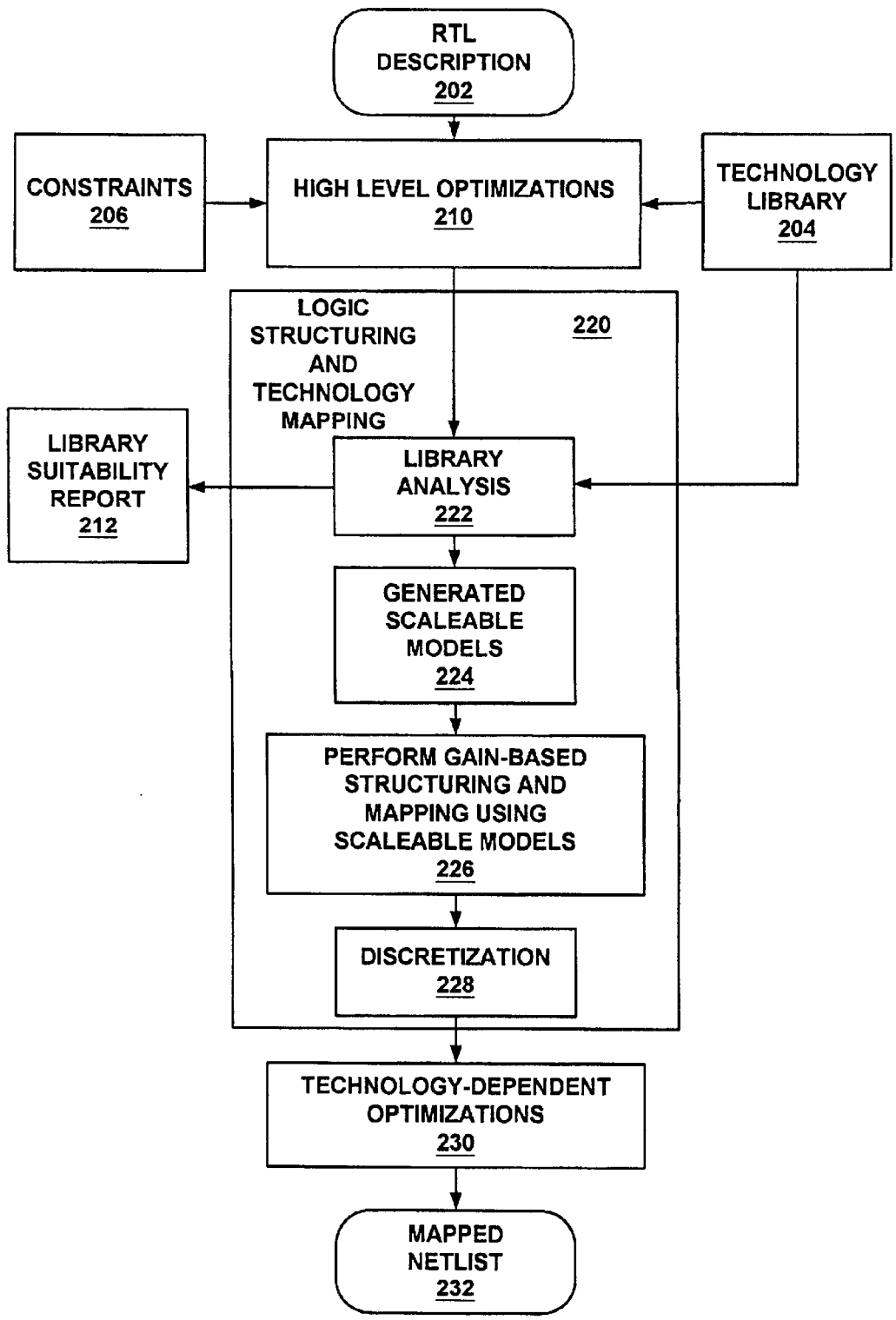
FIG. 2 is a block overview of the logic synthesis and optimization processes in accordance with one embodiment of the present invention.

FIG. 2 illustrates an overall data flow diagram of an EDA process 200 in accordance with an embodiment of the present invention. Process 200 receives an RTL description 202 of a particular integrated circuit (IC) design and also interfaces with constraints 206 defined for the design 202 and a particular ("target") technology library 204 selected by the IC designer to be used for the design 202. As described further below, embodiments of the present invention create an new library from the technology library 204, replace the cells of the netlist with the cells from the new library, perform processes on the replaced netlist and then replace back the new cells of the netlist with discrete cells from the technology library 204 before technology dependent optimizations 230 are performed.

Figure 3:
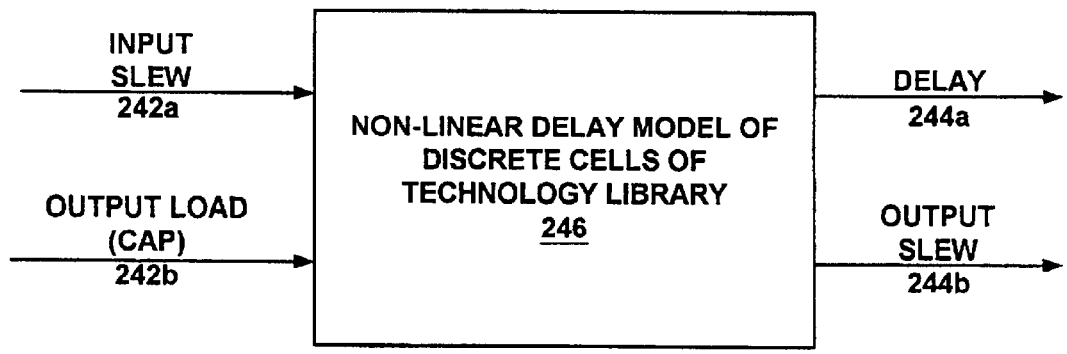
FIG. 3 is a block diagram of an output load-based non-linear delay model (NLDM), or four dimensional look-up table, characteristic of a discrete cell within an input technology library.

The target technology library 204 contains discrete logic cells, each having an output load-based NLDM of FIG. 3 for modeling its delay. In the output load-based NLDM 240, an input slew 242a and an output load capacitance 242b are provided as inputs. The look-up table 246 then provides a delay value 244a and an output slew 244b. In this model, the gain of a cell can be determined by dividing the output load 242b by the input load (capacitance) of the discrete cell. The output load-based NLDM 240 of FIG. 3 is also called the "discrete NLDM" herein. A separate output load-based NLDM 240 is provided for the rise delay for each discrete cell of the technology library and separate output load-based NLDM 240 is provided for the fall delay for each discrete cell.

High level optimizations are performed at step 210 of FIG. 2 based on the RTL description 202, the technology library 204 and the constraints 206 and then high level logic and structuring processes 220 are performed. Processes 210 and 220 are performed during the "early stages" of circuit synthesis, e.g., before the technology dependent optimizations 230 generate the mapped netlist 232. At process 220, library analysis 222 is performed which generates a new library containing scalable cell models 224 and also generates a library suitability report 212.

Figure 4:
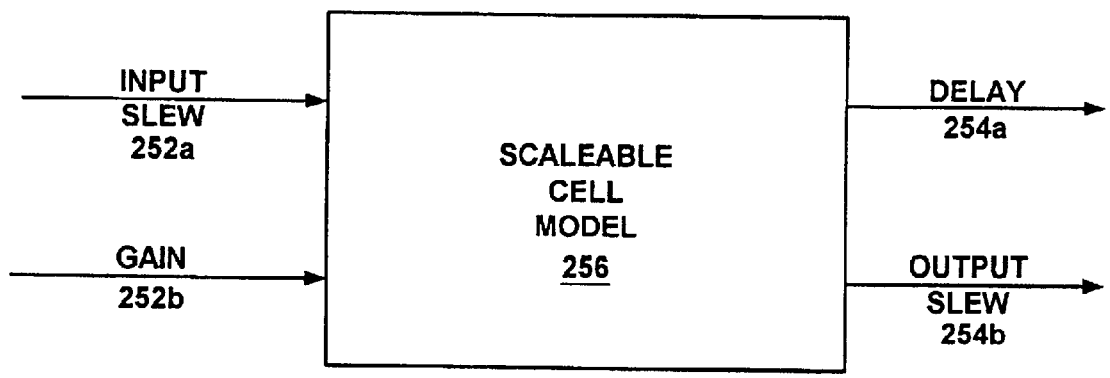
FIG. 4 is a block diagram of a non-linear, gain-based, delay model (NLDM), or four dimensional look-up table, characteristic of a scalable cell in accordance with one embodiment of the present invention.

FIG. 4 illustrates non-linear gain-based delay table 224a as part of a scalable cell model. It contains a scalable delay look-up table 256 that is indexed by two inputs including input slew 252a and gain 252b. It generates two outputs including delay 254a and output slew 254b. A scalable cell model is provided for each cell group (grouped by logic function) of the technology library 204. A scalable cell model includes a non-linear gain-based delay table for rise delay and also one for fall delay and for each timing arc. The scalable cell models of the present invention are used to perform gain-based structuring and mapping at process 226 of FIG. 2. During process 226, the discrete cells (and output load-based delay models) used by the IC design 202 are replaced with scalable cells and gain-based modeling in accordance with the present invention. After mapping, a discretization process 228 is then performed to translate the scalable cells back to discrete cells of the technology library 204. After that, technology dependent optimizations are performed at step 230 which produce the mapped netlist 232.

The present invention derives and uses a delay model that is a load-independent non-linear delay model that also considers transition times. This delay model is significantly different from the constant delay model, because in the present invention, the delay of a gate is not constant. Moreover, the present invention considers the impact of transition times on delay, deals effectively with complex gates with different input capacitances for different input pins, takes into consideration the impact of limited discrete sizes in the technology library and takes into consideration certain design rules like maximum capacitance and maximum transition associated with gates.

Aspects of the present invention perform analysis of the discrete cells in the technology library 204 and derive a continuous (scalable) model 224 (FIG. 2) for each logic function in the library for which the analysis is performed. Optimization processes in the present invention, including technology-independent optimization, timing-driven structuring, logic decomposition, technology mapping and gain-based synthesis then work with this continuous model at step 226 (FIG. 2). At the end, the netlist is discretized at step 228, e.g., the scalable cells in the netlist are converted to discrete cells in the technology library 204. After discretization, traditional late-timing correction techniques (at process 230) are used for delay optimization, design rule fixing and area recovery. Although a number of different technology dependent optimizations can be used effectively within the present invention, in one implementation, step 230 of FIG. 2 can be performed using the Design Compiler (e.g., Design Compiler in DC 1999.10) which is commercially available from Synopsys, Inc. of Mountain View, Calif.

It is appreciated that after library analysis 222, the present invention automatically performs library evaluation to render a judgment 212 as to the suitability of a target technology library 204 for generating scalable cells and for the optimization process 226.

Library Analysis Process 222

Figure 5:
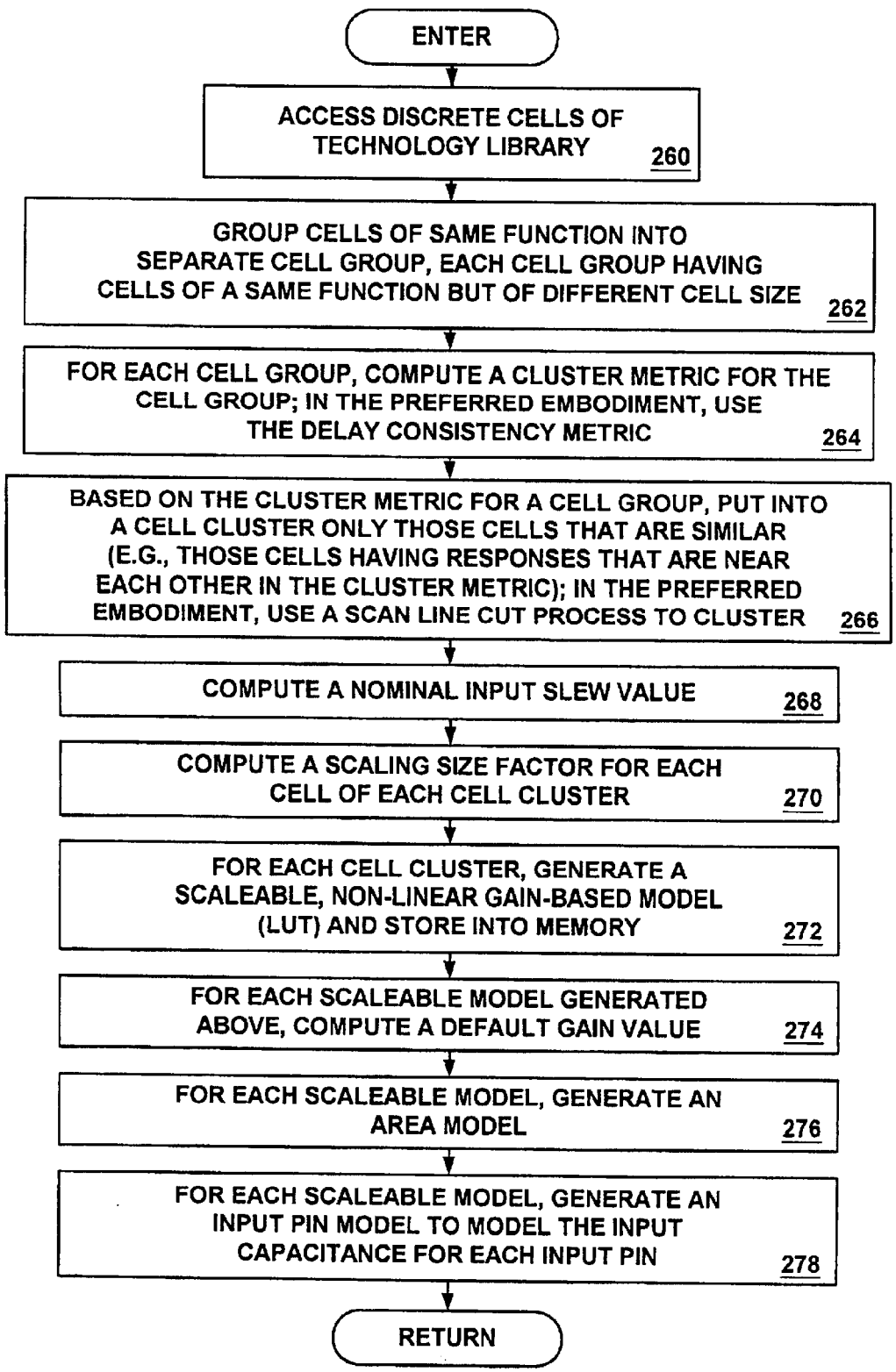
FIG. 5 is a flow diagram illustrating steps in a library analysis process in accordance with an embodiment of the present invention.

The library analysis process 222 is shown in FIG. 5 and is used to generate scalable libraries with scalable cell models that have associated gain-based NLDMs. In one embodiment, library analysis 222 derives an internal scalable library from the discrete technology library 204 for single output combinational cells. The cells in this scalable library 204 are characterized with the new delay model that library analysis 222 derives. Library analysis 222 is performed independent of whether a library is suitable for further optimizations, such as process 226 (FIG. 2). Library analysis 222 consists of several major sub-processes including: logic clustering 264–266; nominal slew computation 268; scaling size computation 270; NLDM generation 272; default gain computation 274; area model generation 276 and input capacitance model generation 278.

Figure 7:
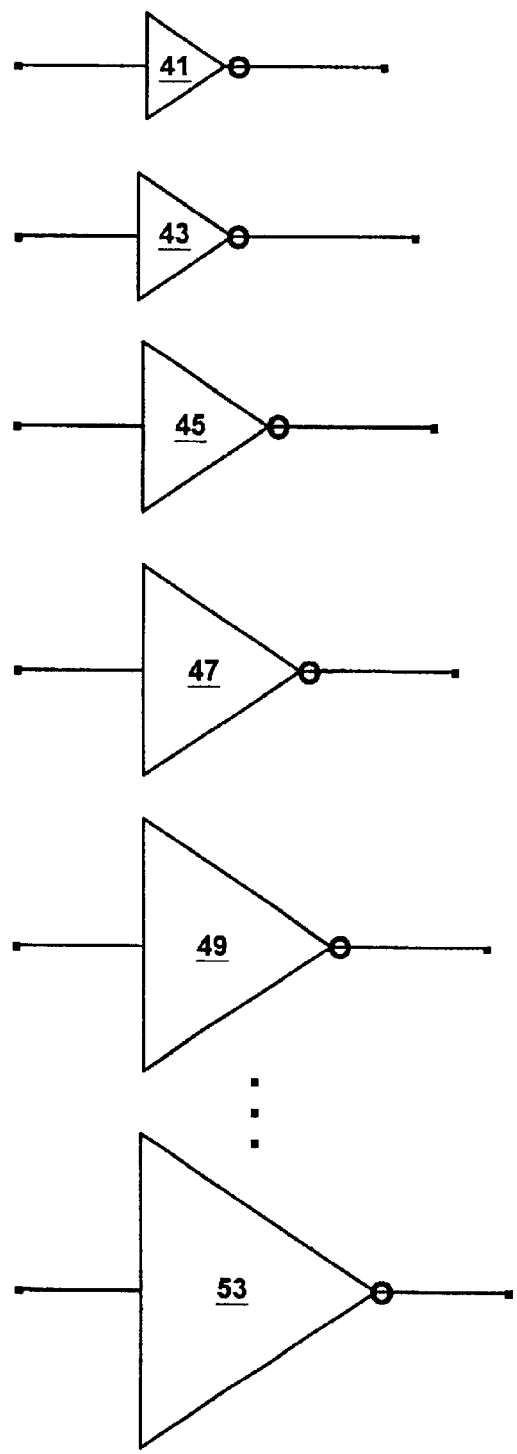
FIG. 7 illustrates multiple exemplary discrete inverter cells of varying size within an inverter cell cluster.

Determine Cell Groups. At step 260 of the library analysis process 222, the present invention accesses the discrete cells of a technology library 204. A discrete library 204 typically has several cells (sizes) which implement the same logic function. These cells are designed to optimize various design parameters like power, area, delay or porosity. At step 262, all single output discrete cells having a common logic functionality (e.g., AND, OR, NOR, NAND, XOR, etc.) are grouped into a cell group. In one embodiment, memory cells (e.g., RAM and ROM) and sequential cells and cells having two or more output pins are ignored by step 260. FIG. 6A illustrates an exemplary result 280 of step 262 where discrete AND gates 11–21 are grouped into cell group 282, discrete OR gates 25–37 are grouped into cell group 284, discrete inverter gates 41–53 are grouped into cell group 286 and discrete multiplexer (MUX) gates 55–67 are grouped into cell group 288. The cells of a particular cell group, while having the same logic function, are typically of different sizes. FIG. 7 illustrates an exemplary cell group 286 including inverters 41–53 of progressively larger size. As a gate increases in size, the load it can drive typically increases.

Determine Cluster Metric for Each Cell Group. At step 264, a cell cluster metric is determined for each cell group identified in step 262. For generating a scalable cell for any logic function, process 222 performs clustering of cells that implement the same logic function and have similar characteristics. Cluster metrics are used to provide a measure to identify cells with similar characteristics. The cluster metric is then used by step 266 to determine a separate cell cluster for each cell group. A cell cluster is a subset of the cells in each cell group and may include all the cells of the cell group in certain circumstances. There are several methods the present invention can use to determine the cell cluster metric and exemplary methods are described below. At the completion of steps 264 and 266, each identified cell group of step 262 has its own cell cluster. FIG. 6B illustrates an exemplary result 290 of steps 264 and 266. A cell cluster for the AND gate functionality is 292 and includes the subset of AND gates 13–18 corresponding to cell group 282. Similarly, a cell cluster for the OR gate functionality is 294 and includes the subset of OR gates 29–37 corresponding to cell group 284. A cell cluster for the inverter gate functionality is 296 and includes the subset of inverter gates 41–49 corresponding to cell group 286. Lastly, a cell cluster for the mux gate functionality is 298 and includes the subset of mux gates 55–61 corresponding to cell group 288.

The preferred embodiment of the present invention utilizes the delay consistency cluster metric at step 264. Therefore, a delay consistency metric is generated for each cell group identified in step 262. Gain of a discrete cell is defined as the ratio of output capacitance to average input capacitance of the discrete cell. Therefore, under this cluster metric, cells in the same cluster should have similar delay numbers for all the timing arcs from input pins to the output pins for same gain values. Under this metric, a cell group is selected and an exemplary gain value is determined, e.g., between 3 and 8, in one embodiment. The input capacitances of each discrete cell of the selected cell group are then separately averaged so that each discrete cell has its own average input capacitance. From the selected gain value and the average input capacitance of each cell, an output load capacitance can be computed by multiplying the respective average input capacitances by the selected gain. Assuming a nominal input slew of zero, the present invention then utilizes the discrete NLDMs (e.g., input slew and output load capacitance are supplied as inputs) of the discrete cells of the selected cell group to determine the rise and fall delays for all the discrete cells of the selected cell group. This is repeated for all cell groups.

Figure 8:
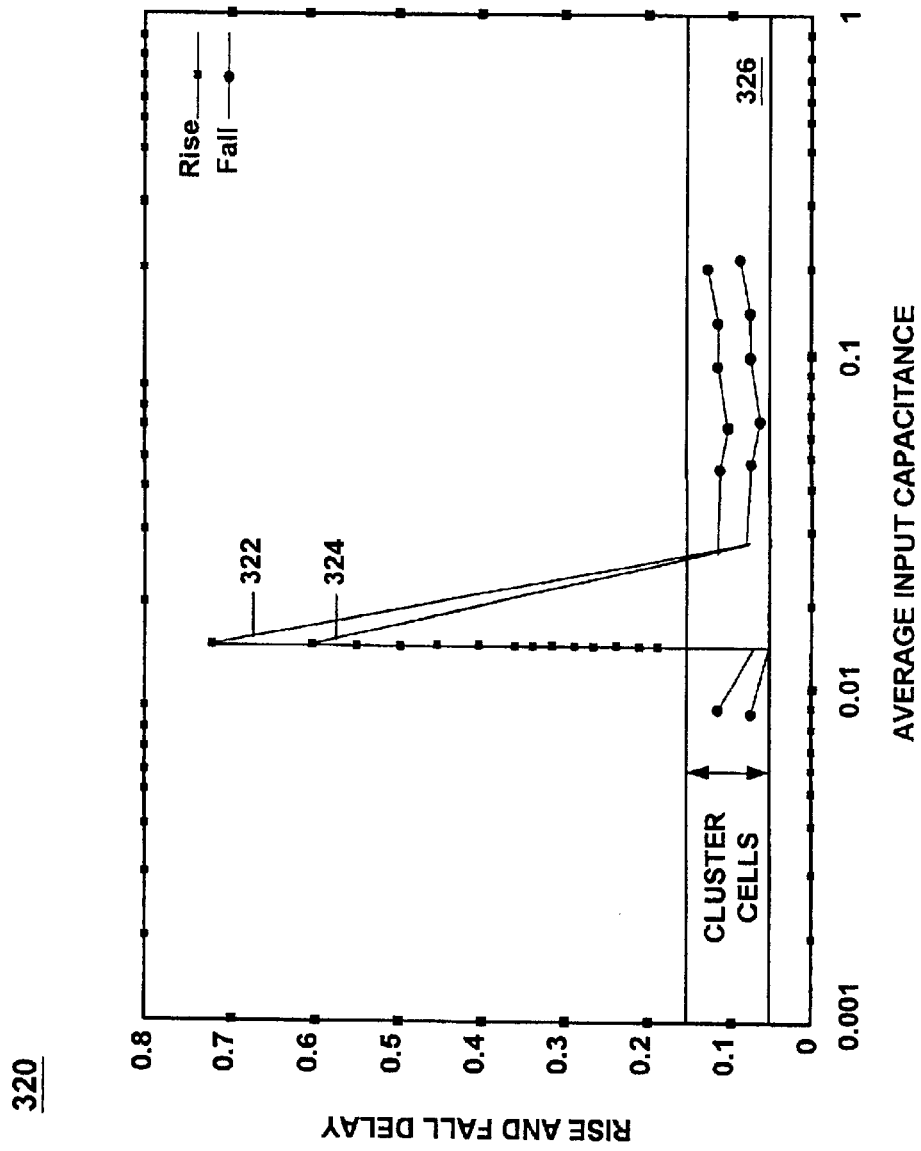
FIG. 8 is a graph of rise (and fall) delay of the cells of an exemplary cell group against their individual average input capacitances as used in the delay consistency clustering metric of an embodiment of the present invention.

FIG. 8 is a graph 320 of rise and fall delays of discrete inverter cells from the exemplary library 204 with the delay values computed using an exemplary gain value set to 3 and a nominal input slew of zero. Graph 322 corresponds to the fall delay and graph 324 corresponds to the rise delay for an exemplary inverter cell group having approximately 20 inverters. On the x-axis of the graph is the input capacitance (average input capacitance) of the discrete inverters on a logarithmic scale and on the y-axis are the rise and fall delays of the corresponding inverter cell. The cells 326 within the two black lines will most likely be included in the cell cluster for the inverter cells as they have consistent delay characteristics while the remaining cells will not be considered suitable for the cell cluster on the basis of their delay characteristics. Therefore, using the delay consistency metric, a cluster of approximately 8 cells is created in this exemplary case. At step 266, the above process is then repeated for each cell group using the delay consistency metric.

Typically, most of the cells that are excluded from the cell cluster have been derived by internal buffering. Cells derived using internal buffering will most likely get ruled out during logic clustering as they typically have poor correlation with other non-buffered cells.

Figure 9:
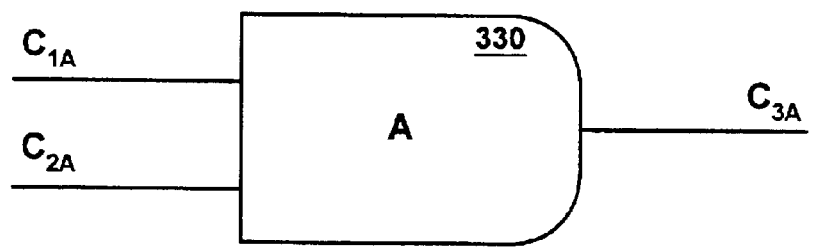
FIG. 9 illustrates corresponding input pins of two logic gates of a same discrete cell group.
Figure 9:
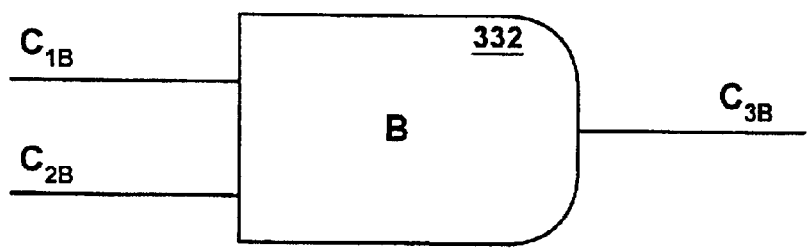
Figure 10:
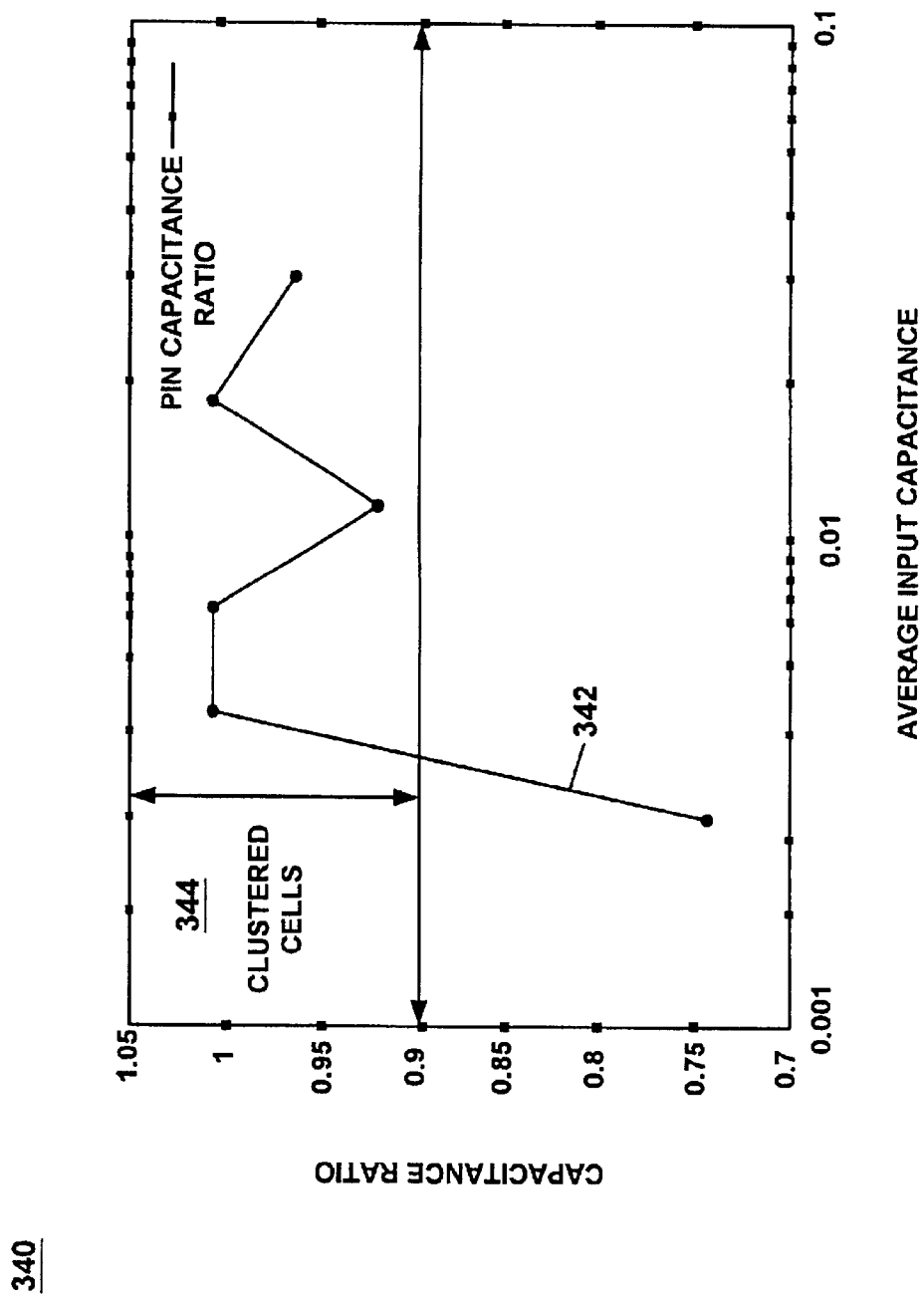
FIG. 10 is a graph of input pin capacitance ratio of the cells of an exemplary cell group against their individual average input capacitances as used in the input pin consistency clustering metric of an embodiment of the present invention.

In an alternate embodiment, at step 266 of process 222 (FIG. 5) an input pin capacitance consistency cluster metric can be used in lieu of the delay consistency metric. According to this second metric technique, the input capacitance of corresponding input pins of discrete cells of a selected cell group should have similar ratios. FIG. 9 illustrates an exemplary AND gates 330 (A) and 322 (B). C1A and C1B are the input capacitances, respectively, for the first inputs of gates A and B. C2A and C2B are the input capacitances, respectively, for the second inputs of gates A and B. For instance, the ratio of C1A/C1B should be equal to the ratio of C2A/C2B. This relationship can readily be rewritten so that each capacitance ratio is expressed in terms of the input pins of a same cell. FIG. 10 is a graph 340 of the ratio of input pin capacitances of two input NAND gates in a typical technology library 204. On the x-axis of the graph is the average input capacitance of the discrete NAND gates on a logarithmic scale and on the y-axis is the ratio of pin capacitance. Graph 342 is made of the discrete NAND gates of the exemplary NAND cell group having 6 gates. During clustering, cells 344 above the horizontal line will most likely be included in the cluster while cells below the line will be excluded on basis of inconsistent input pin capacitance ratios.

Figure 11A:
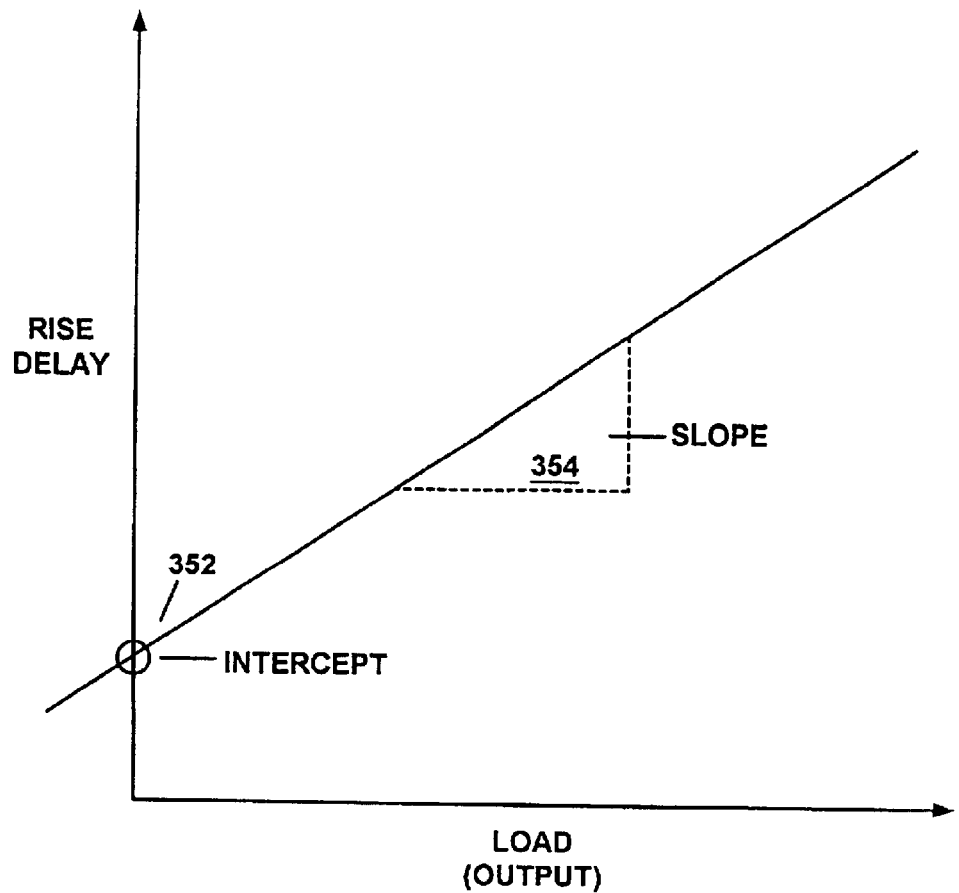
FIG. 11A and FIG. 11B illustrates two exemplary delay versus output load graphs used in the intercept/slope (LDM) consistency clustering metric of an embodiment of the present invention.
Figure 11B:
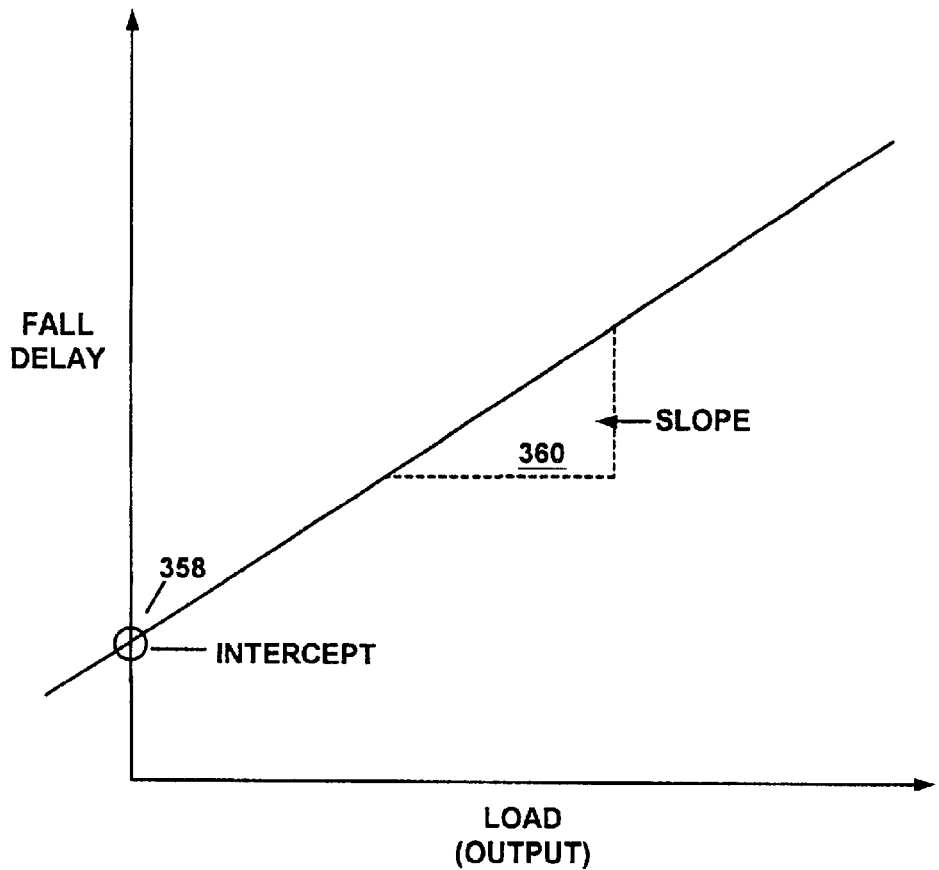

In yet another alternate embodiment, at step 266 of process 222 (FIG. 5) an intercept/slope consistency metric can be used in lieu of the delay consistency metric and the input pin capacitance consistency metric. According to the intercept/slope consistency metric, for each discrete cell, a LDM for output rise and fall delays are derived using the discrete NLDM tables in the technology library 204. FIG. 11A illustrates an exemplary graph 350 made for a discrete cell of a selected cell group. It plots rise delay (obtained from the discrete NLDM with input slew set to zero) versus output load for the given cell. An intercept 352 and a slope 354 are computed for the given cell. This is done for each cell of the selected cell group. FIG. 11B illustrates an exemplary graph 356 made for the discrete cell of the selected cell group. It plots fall delay versus output load for the given cell. An intercept 358 and a slope 360 are computed for the given cell. This is also done for each cell of the selected cell group. A delay_avg metric for the given cell is computed as the average of the RISE and FALL output delay line intercepts 352 and 358. A delay_ratio metric is also computed as the ratio of the RISE to FALL output delay line slopes 354 and 360 for the given cell. The above is then repeated for each cell of the selected cell group. Clustering is performed such that these two metrics for cells in a cluster are within acceptable limits. This is then repeated for each cell group.

Figure 12:
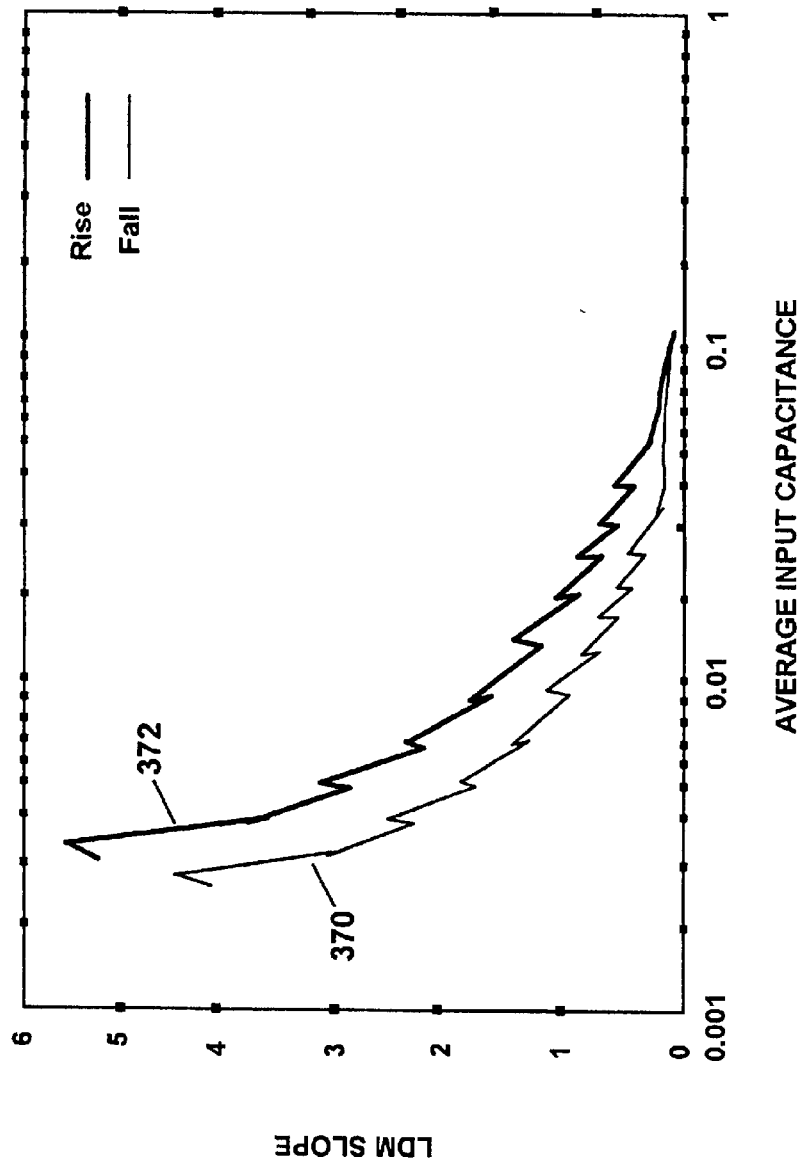
FIG. 12 is a graph of LDM slope versus average input capacitance for an exemplary group of discrete cells used in another consistency clustering metric of an embodiment of the present invention.

In a fourth alternative embodiment, the metrics computed at step 264 are based on the metric relationship that the slopes of the above LDM should be inversely proportional to the average input capacitance of the discrete cells. FIG. 12 is a graph 368 of the rise (plot 372) and fall (plot 370) slopes of the LDM for discrete inverters in the technology library 204. On the x-axis of the graph is the input capacitance of exemplary cell group (e.g., the inverter) on a logarithmic scale and on the y-axis are the rise (plot 372) and fall (plot 370) slopes of the LDM. Clustering most likely does not rule out any of these cells on the basis of their LDM slopes due to their adherence to the above metric relationship.

Determine Cell Clusters from Cluster Metrics. Within the embodiments of the present invention described above, one or more of the above measures can be used to cluster cells from a discrete library 204. Using all of the above criterion ensures a good correlation between discrete and scalable cells but may also reduce the size of the cluster. On the other hand, using too few measures can result in a badly correlated scalable library that may result in too many errors during discretization process 228 (FIG. 2). It is appreciated that intermediate steps of process 266 may locate many clusters for a particular logic function. If many clusters are derived for a particular logic function, the present invention uses only the single best cluster (of the derived clusters) where the errors related to the above metrics are minimal and the size of the cluster is above a certain threshold. When a best cell cluster for a cell group is selected, cells in all other unselected clusters for that cell group are ignored when constructing scalable cell model based on the cell group, however technology-dependent optimization (step 230 of FIG. 2) does still consider all discrete cells in the technology library 204.

At step 266 of FIG. 5, the present invention examines the data from the metrics generated above, for each cell group, and determines the set of discrete cells that should be placed into a cell cluster for that cell group. This is repeated for each cell group. Clustering is the technique of grouping cells having similar metric characteristics (and excluding others that are different) and a number of various well known methods can be used to solve this problem within the present invention. Two exemplary methods are described below. Refer to the example of FIG. 8 and assume that only delay numbers are being used for clustering. One possible method of computing the largest cluster is as follows. Choose any one cell and find out all other cells in the set that have delay numbers within ±X % of the selected cell. All these cells put together represent a possible cluster. However, this does not represent the only cluster for these cells as the cluster was computed assuming one chosen cell as the midpoint of the cluster. To compute all the clusters the above step can be repeated for all the cells in the set. Further, the step needs to be repeated for all the delay arcs of the cells. The complexity of this process is $O(n^2 \times m)$ where n is the size of the set and m is the number of delay arcs. A modified scan line process has been developed that significantly improves the speed of the above described process. The scan line cutting process reduces the runtime by reducing the $O(n^2)$ computations done for each arc.

Figure 13:
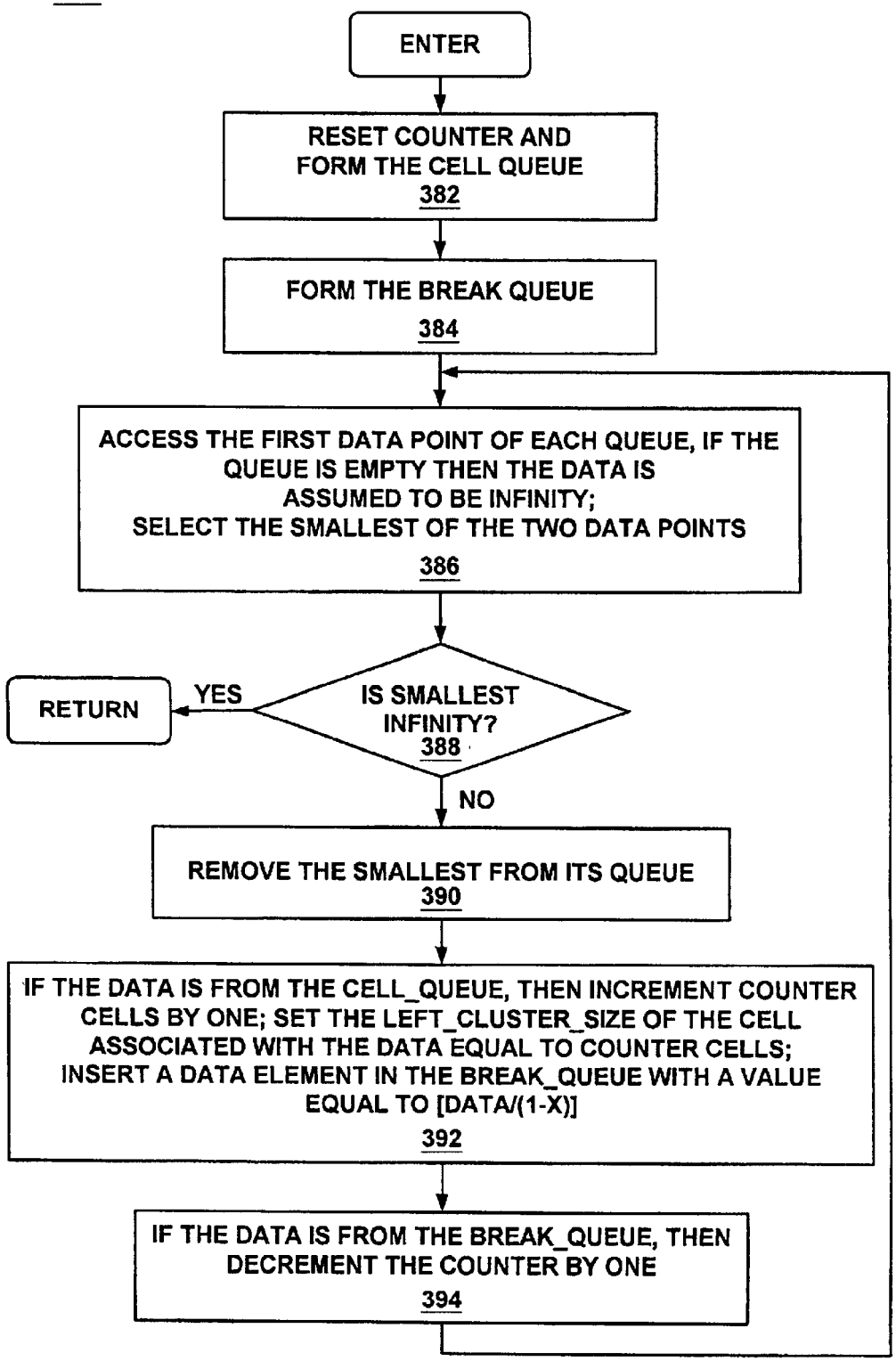
FIG. 13 is a flow diagram of steps of a scan line cutting process used for determining cell clustering given a consistency clustering metric in accordance with an embodiment of the present invention.

FIG. 13 illustrates the scan line cutting process 266 in more detail. Firstly, at step 382 a cell queue is computed. The delay of the arc being considered is computed for all the cells for a fixed gain value. That is, for a fixed gain value (e.g., from 3 to 8), the output load of a cell can be computed based on its input capacitance (as described above) and a zero input slew. Using the discrete NLDMs, the delay can be computed for each discrete cell. The cells are sorted in ascending order of the delay and added to the cell queue. Also a counter, called cells, is initialized to zero at step 382. At step 384, another queue, called break queue, is initialized to a null queue. Next, a scan line based process sweeps over the two queues until both the queues are empty. This sweep computes, for each cell, the number of cells with delay less than the cell and greater than (1−X) times the delay of the cell. This value is also referred to as the left_cluster_size of the cell.

The steps performed during the sweep are as follows. At step 386 of FIG. 13, the first data in both the queues are found. It the queue is empty, the data is assumed to be infinity. The smallest of the two data items is then selected. At step 388, if the smallest data is infinity, then process 266 returns. At step 390, the smallest data is popped from its respective queue. At step 392, if the data is from the cell queue, then the counter is incremented by one, left_cluster_size of the cell associated with the data is set equal to counter cells and a data element is inserted in the break queue with value equal to data/(1−X). At step 394, if the selected data is from the break queue, then the counter is decremented by one and processing returns to step 386.

The above steps are again repeated with descending order of delay to compute the right_cluster_size of each cell. Finally, the right_cluster_size and the left_cluster_size of each cell are combined to get the total cluster_size for each cell. The cell with maximum cluster_size is the one used as the mid-point of the cluster and all cells with delay within ±X % are included in the cluster. Subsequent clusters can be computed by repeating the above process while excluding all the cells previously included in a cluster.

Exemplary process 266 of FIG. 13 considers one timing arc to compute the clusters. However, all the timing arcs are considered while clustering. One way to achieve this is to compute the clusters based on each timing arc separately and then take the intersection of the clusters. This can be done in O(mn) time. Exemplary process 266 of FIG. 13 operates well as long as the cell distribution is such that there is only one cluster of acceptable size. In case of multiple clusters, all clusters between two arcs should be compared and the intersection computed to get the largest clusters. Hence, the complexity grows to $O(mnk^2)$, where k is the maximum number of clusters within an arc. However, for most vendor libraries, k is less than 3.

Compute Nominal Input Slew Value. Although an input slew of zero was assumed and used in the clustering processes 264 and 266 (FIG. 5), in an alternate embodiment of the present invention, a nominal slew value (non-zero) can be computed and used in lieu of the zero value. At step 268 of FIG. 5, this nominal slew value is computed by the present invention.

Figure 14:
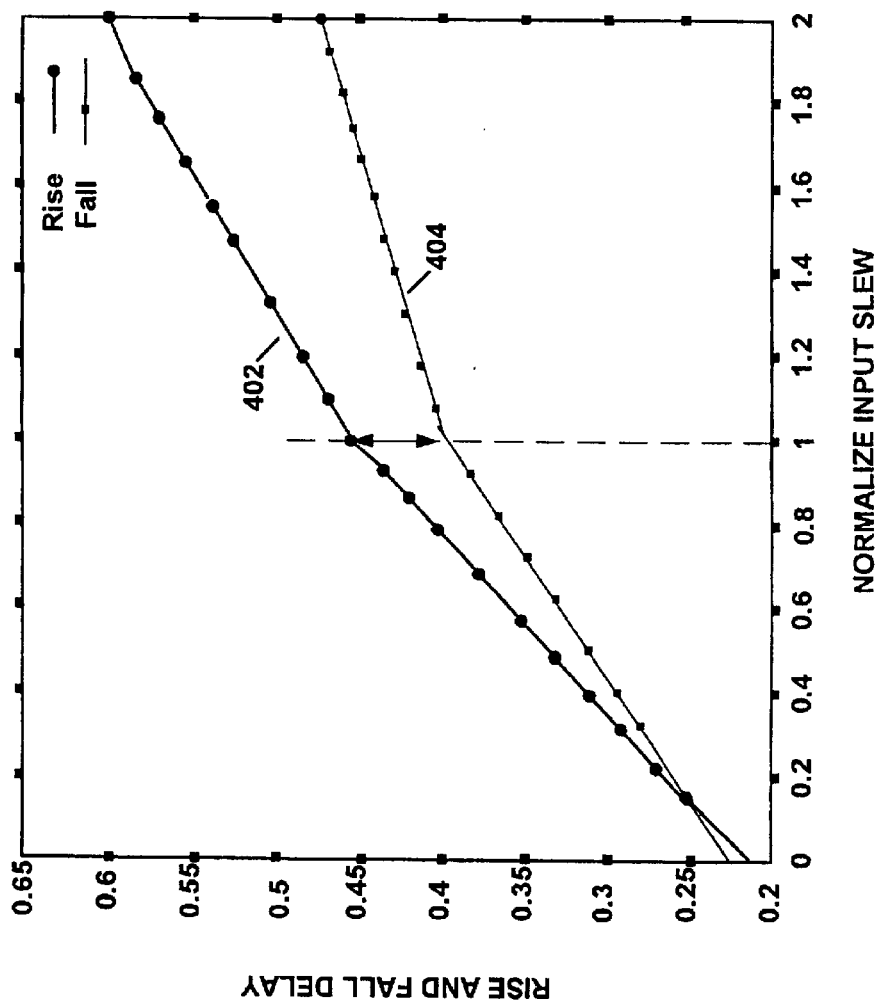
FIG. 14 is a graph of rise and fall delay versus normalized input slew for a group of discrete cells of the technology library and illustrates the impact of input slew on delay computations.

As shown in FIG. 14, slew numbers can significantly change the performance of a gate. The library analysis process 222 computes a nominal slew that is used as the default input slew for future delay number computations. The impact of slew on delay is shown in FIG. 14. On the x-axis of the graph 400 is the input slew divided by nominal slew and on the y-axis are the rise and fall delay of a typical inverter. Rise delay is represented by plot 404 while fall delay is represented by plot 402. For zero input slew (x=0), rise and fall delays of the discrete inverter are almost equal. However, for nominal input slew (x=1) the delays are significantly different. Normally, the input slew to a gate is closer to the nominal slew and hence using the nominal slew value during library analysis 222 and evaluation can lead to better results.

One method for computing the nominal slew at step 268 of FIG. 5 is to compute the output slew of all the discrete cells in any cluster after setting their gains to a fixed value between 3 and 8. (The output slew of the discrete cell is still computed using the discrete NLDM, where output load is computed as the ratio of the selected gain and average input capacitance of the cell and the input slew is assumed zero.) Then the average of all these slews is computed as the nominal input slew for all cells. Another method for computing the nominal slew at step 268 is similar to the above method except that only clusters of certain basic gates like inverter, NAND2 (e.g., 2=two input), NOR2, NAND3, and NOR3 are used to compute the nominal slew value.

Figure 15:
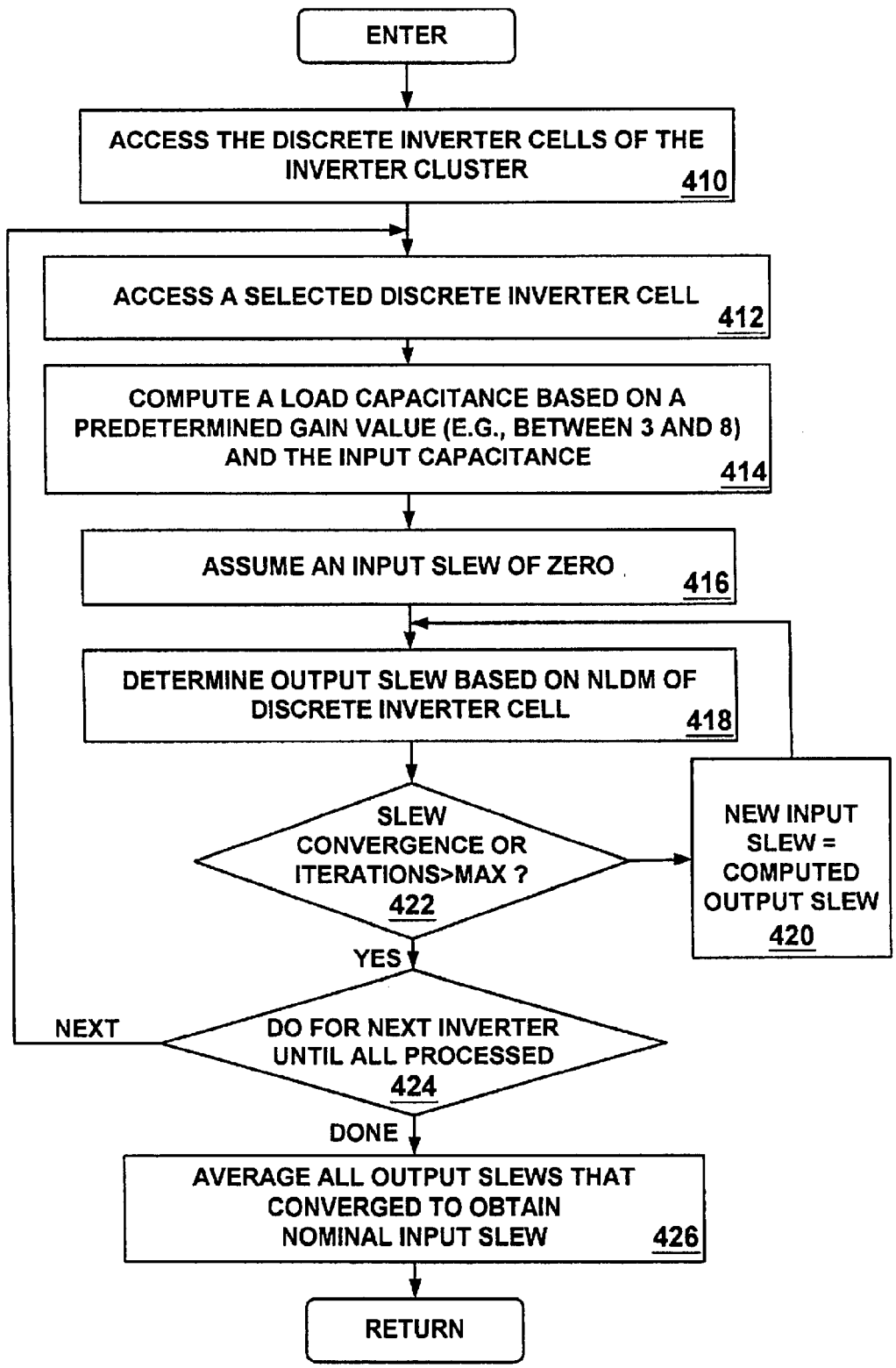
FIG. 15 is a flow diagram illustrating steps of the nominal slew computation process in accordance with an embodiment of the present invention.

FIG. 15 illustrates a preferred embodiment of the present invention for computing nominal slew at step 268. According to the method of FIG. 15, only inverters are used and at step 410, the inverter cells of the inverter cluster are accessed. At step 412, a selected inverter cell is obtained. At step 414, an output load capacitance for the selected cells is computed for a reasonable value of gain between 3 and 8 and the cell's average input capacitance. An input slew of zero is initially assumed at step 416. At step 418, the output slew of the selected inverter cell is computed based on the computed output load capacitance and input slew using the cell's discrete NLDM. This computed output slew becomes the new input slew at step 420 and the procedure 268 is repeated until the slew converges or a pre-fixed number of iterations are exhausted as tested by step 422. This is then done for each inverter cell of the inverter cluster as shown by step 424. At step 426, the nominal input slew is computed as the average of the slews computed for all the inverter cells for which the iteration converged. Otherwise, the nominal slew is set to be 0.0.

The computed nominal input slew is used for all cells and can be used for future delay computations. In an alternate embodiment of the present invention, the computed nominal input slew can also be used to perform clustering (e.g., step 264 and step 266 of FIG. 5) in lieu of the assumed zero input slew.

Determine Scaling Sizes. At step 270 of FIG. 5, the present invention determines a scaling size for each discrete cell of the cell clusters. A discrete cell represents a scalable cell with a fixed size. This is also known as the scaling size of the discrete cell. As a starting point average input capacitance is a good measure for the scaling size of a gate. However, this is not completely accurate. This is because the input capacitance of a discrete cell is equal to the sum of the transistor capacitance and the via, metal and poly capacitances. For large gates, the latter can be ignored but for the smaller gates these capacitances become significant. Hence the scaling size needs to be normalized for these gates. This is mainly required so that scaling size of a gate scales consistently as the size of the gate increases.

Figure 16:
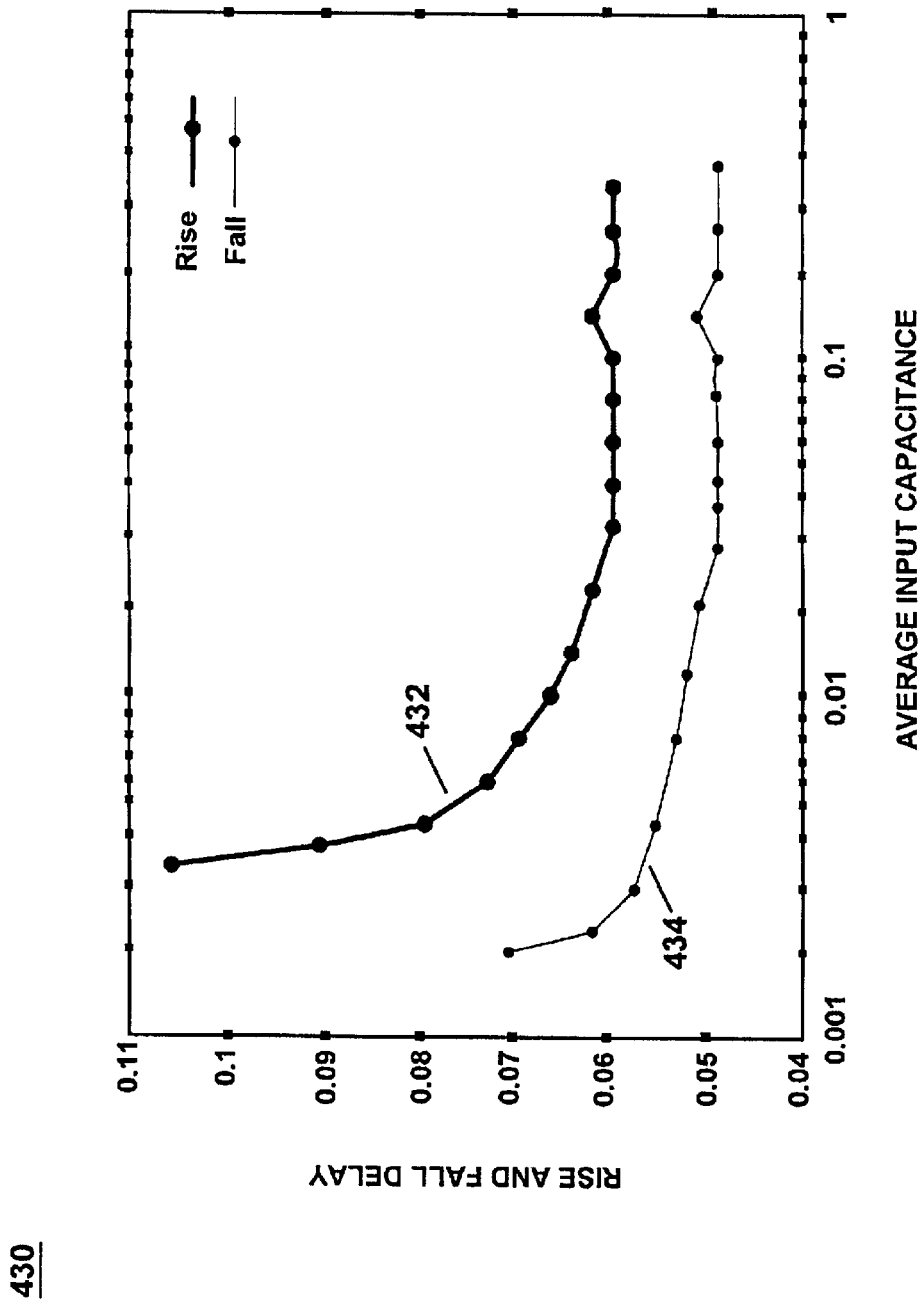
FIG. 16 is a graph of rise (and fall) delay versus average input capacitance for an exemplary group of discrete cells and illustrates the larger delay values associated with smaller sized cells that requires scaling-size compensation.

FIG. 16 shows a graph 430 of the delay of discrete inverters for a gain value of 3. The output load has been computed using the average input capacitance as the scaling size and a fixed gain value of 3. On the x-axis of the graph is the average input capacitance on a logarithmic scale and on the y-axis are the rise and fall delays of all the inverters in a cluster. Plot 432 represents the rise delay and plot 434 represents the fall delay. The delay of the smaller sized cells (left-hand side) is very different than that of the larger sized cells. This is because the scaling size of these cells has been biased by other parasitic capacitances, and as a result the computed output load for a fixed gain is significantly higher.

Embodiments of the present invention, at step 270, utilize the following processes to normalize the scaling size for each cell. By normalizing the scaling size for individual cells, this facilitates entry of smaller sized cells into the cell cluster that would otherwise be excluded from the cell cluster. One method for computing the scaling size is to require that each library vendor separately specify the above two components of the input capacitance and then only use the average transistor capacitance as the scaling size for each cell.

Figure 17:
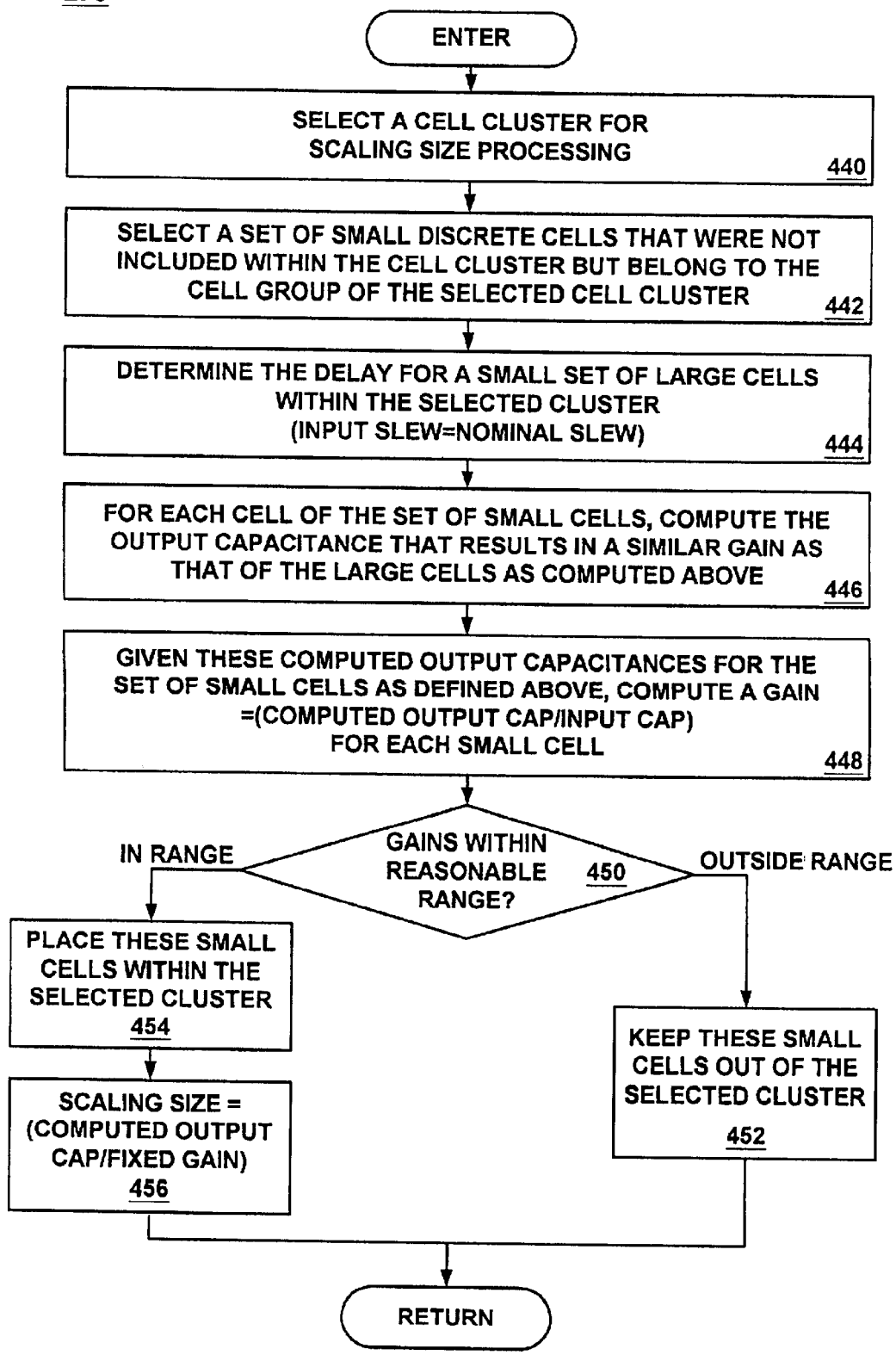
FIG. 17 is a flow diagram illustrating steps in the scaling size computation process in accordance with an embodiment of the present invention.

FIG. 17 illustrates steps used by the preferred embodiment of the present invention for determining scaling sizes for the discrete cells. Process 270 of FIG. 17 normalizes the average input capacitance based on the delay characteristic of the cell. For example, all cells for a fixed gain should have the same delay for all the timing arcs (assuming that the input slew is constant). At step 440, a cell cluster is selected for size scaling. At step 442, a set of small discrete cells (of the cell group corresponding to the selected cell cluster) that were not included in the selected cell cluster are selected. At step 444, the present invention determines the arc delay for a small set of large cells within the selected cell cluster using the computed nominal slew as the input slew and a fixed gain (e.g., from 3 to 8). Therefore, delay values are computed by setting the input slew equal to the nominal slew. At step 446, for the smaller cells, the output capacitance is computed for each that results in similar delay numbers for all the timing arcs. At step 448, the computed gain for each small cell is determined by dividing its computed output capacitance by its average input capacitance.

At step 450, for those small cells having a computed gain that is outside the fixed range (e.g., 3 to 8), step 452 is entered, else step 454 is entered. At step 452, these small cells remain excluded from the selected cell cluster. For step 454, these small cells are placed within the selected cell cluster and the scaling size for each is computed at step 456 as its computed output capacitance (from step 448) divided by the fixed gain value used in step 444. The above process 270 is repeated for each of the cell clusters. It is appreciated that for all subsequent usage, the gain of a discrete cell is equal to its output capacitance divided by its scaling size, not its input capacitance.

Gain-Based NLDM Generation. Library analysis 222 of FIG. 2 derives a gain-and-slew-based (load-independent) NLDM, as shown in FIG. 4, for all scalable cells. Process 272 utilizes the information determined above for generating the gain-and-slew-based (load-independent) NLDMs. This "gain-based" NLDM is a four-dimensional table with the four dimensions being input slew, gain, delay and output slew. In accordance with the present invention, different gain-based NLDMs are computed for all timing arcs of the scalable cell for both rise and fall delays and for rise and fall transitions. Two different methods can be used to compute the gain-based NLDMs within process 272.

Figure 18:
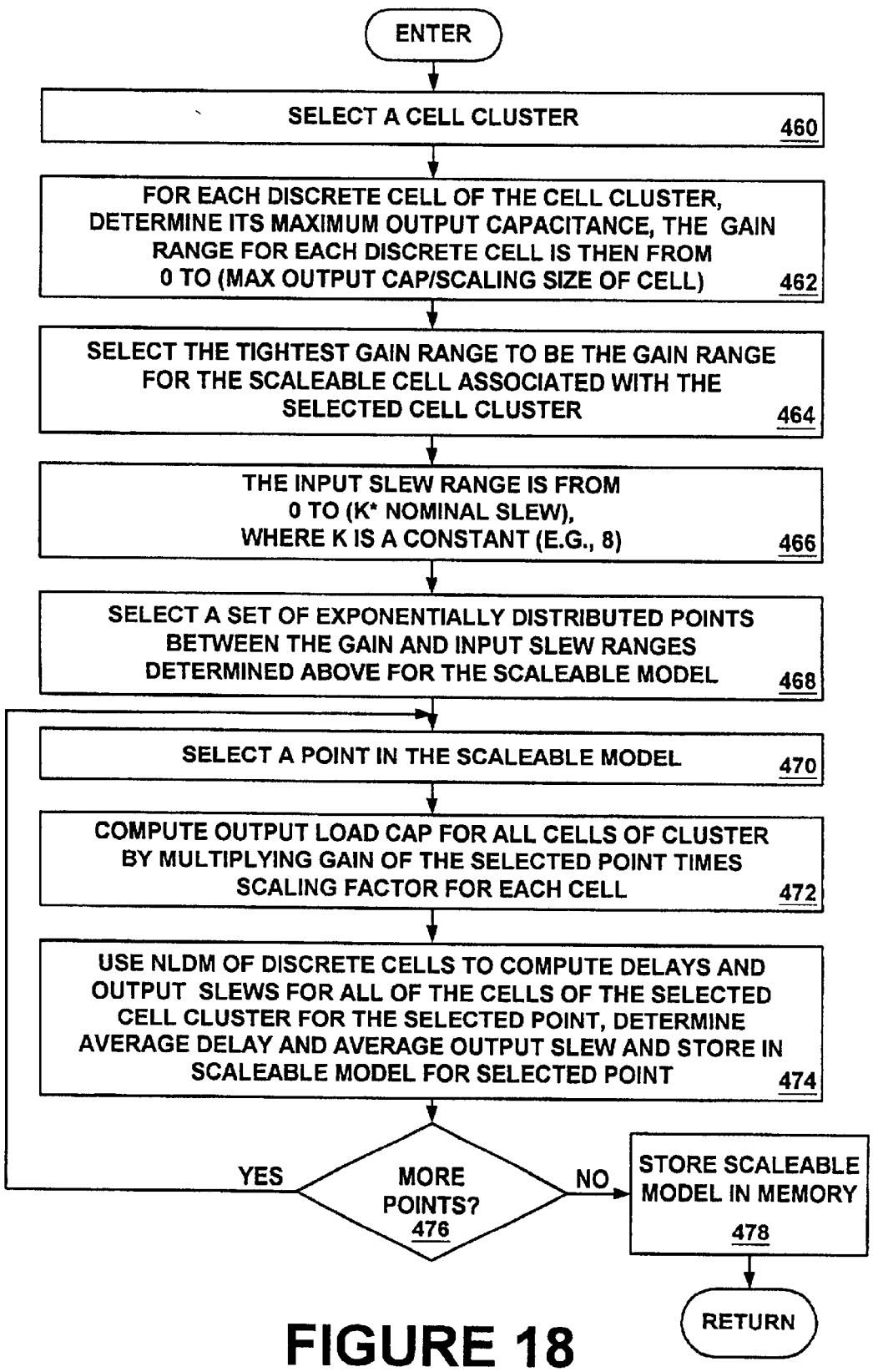
FIG. 18 is a flow diagram illustrating steps in the process for computing the scalable non-linear, gain-based delay models in accordance with an embodiment of the present invention.

FIG. 18 illustrates the step of process 272 for the preferred embodiment of the present invention for constructing the gain-based NLDMs for each scalable cell. Generally, average delay for all the discrete cells corresponding to the scalable cell (e.g., the discrete cells of a selected cell cluster) is used to generate a NLDM. At step 460, a cell cluster is selected. First, the points of the NLDM are identified. At step 462, for each discrete cell of the selected cell cluster, the maximum output capacitance is obtained. The output capacitance for a discrete cell varies between 0 and output_max_capacitance (given from the technology library 204). The maximum gain range for each discrete cell is then computed as being from zero to the maximum output capacitance divided by scaling size of the discrete cell. This is repeated for each discrete cell of the cell cluster.

At step 464 of FIG. 18, for all the discrete cells, the tightest ranges of all these ranges of step 462 are computed and used as the gain range for the scalable cell. At step 466, the input slew range is computed. The input slew does not have a maximum limitation. Hence a good range that is often used is between 0 and some constant, k, times the nominal slew where k is 8 (in one example). At step 468, the NLDM index points are exponentially distributed between the determined gain and input slew ranges.

At step 470, a gain and slew index point is selected within the two ranges determined above. Each point of step 470, a gain value and an input slew value are known and these become points in the gain-based NLDM table of the scalable cell. For a given point (e.g., fixed input slew and gain), at step 472, the output capacitance of a discrete cell is computed by multiplying the gain with the scaling size of the cell. At step 474, the delay of all the discrete cells of the selected cluster are computed (for the given index point) using the corresponding discrete NLDMs (FIG. 3) of these cells. The average of all these delays is used to compute the delay of the scalable cell for this index point. At step 476, steps 470–474 are repeated for all the index points selected in step 468. At step 478, the gain-based NLDM for the selected cell cluster is then stored in memory. Process 272 is done for rise delay and for fall delay and for each timing arc of the scalable cell. This entire process is then repeated for each cell cluster.

In an alternative embodiment, another method is used to compute the gain-based NLDMs. In this method, the gain-based NLDM model is set identical to a preferred discrete cell within the selected cell cluster corresponding to the scalable cell. If the preferred cell is selected correctly, this gain-based NLDM model is better for the optimization engine. Often the mid-size discrete cell makes a good preferred cell, assuming the size of the selected cell cluster is reasonable. The above is then repeated for each cell cluster.

According to either of the above two methods, at the completion of step 272 a scalable cell model (having an associated gain-based NLDM) is generated and stored in memory for each of the cell clusters identified in step 266 (FIG. 5). Within each scalable cell model, a separate gain-based NLDM is provide for each timing arc and for rise and fall delay.

Default Gain Computation. At step 274 of FIG. 5, a default gain is computed for each of the scalable cells generated in step 272. In the gain-based NLDM of the present invention, delay is load-independent and is a function of input slew and gain. The load-independence property of this delay model is leveraged within the optimization process (e.g., process 226), particularly technology mapping. However, the basis for this is to have a reasonable value of default gain value for every scalable cell. It is also required to have the value of this default gain within a particular range, such that the discretization process 228 using the default gain value can find a discrete cell corresponding to that gain value of the scalable cell. Essentially, this gain range should be a function of the instance-specific load seen by the scalable cell and input capacitances of the discrete cells corresponding to the scalable cell.

Two processes can be used to determine the default gain value for a scalable cell and each is described below. According to the first process (used by the preferred embodiment), the midpoint of the NLDM is used. The NLDM for the discrete cells specifies a range of the loads. Using the midpoint ensures the cell is within reasonable operating conditions. The midpoint divided by the scaling size of the cell gives the gain value. The average of all the gain values for all the discrete cells in the selected cluster can then be used as a default gain for the selected scalable cell. This is then repeated for all scalable cells.

According to the second process to determine the default gain value for a scalable cell, a fixed-delay-based default gain is used. In this method, first a delay number T or a scalable inverter is computed as the average delay of all the discrete inverters in the cluster for a fixed gain value between 3 and 5. Next the default gain of all the scalable cells is computed so that the average delay of all their arcs is T, if the gain of the cell is equal to the default gain. For this an LDM approximation of the NLDM of the scalable cell is used to achieve convergence.

Area Model Generation. At step 272 of FIG. 5, area is modeled by the library analysis process 222 for each scalable cell as a linear function of output load. At step 272, the model essentially estimates the area of a scalable cell as a function of scaling size of all discrete cells corresponding to the scalable cell. The output load and the gain of a scalable cell are used to determine the scaling size which aids in identifying the area of the scalable cell. However, because area is a step function, a linear approximation is likely to be erroneous.

Figure 19:
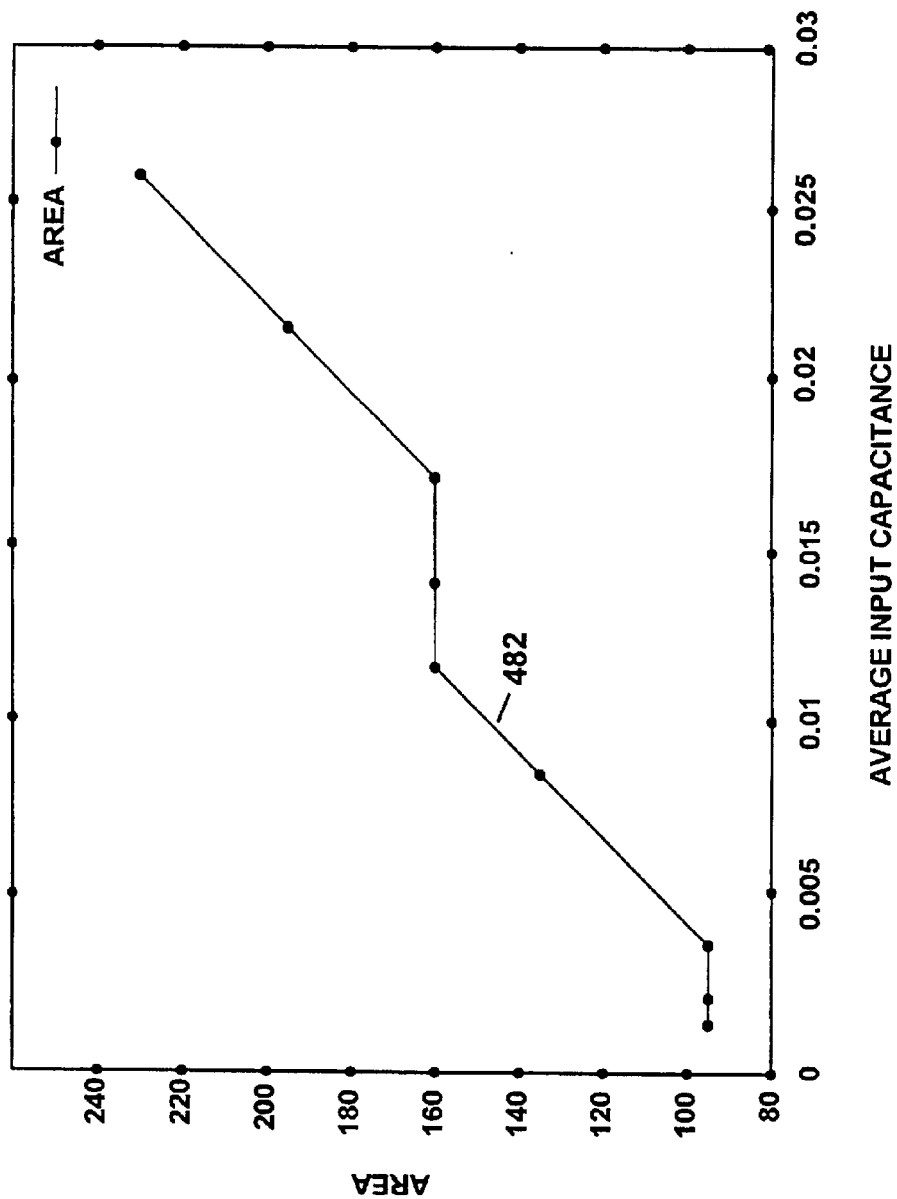
FIG. 19 is a graph of the area of discrete cells against their average input capacitance and is used to model the area for the scalable non-linear, gain-based delay models of the present invention.

FIG. 19 is a graph 480 that plots the area of discrete cells against their average input capacitance. On the x-axis of the graph is the average input capacitance and on the y-axis is the area of the discrete cells. As shown in the plot 482, there exists several discrete cells with the same area and then suddenly the area increases. Thus, a linear area model is bound to have some error. However, in practice, the error does not have significant impact on the synthesis quality of results because area is used as a secondary cost with delay being the primary cost.

Input Capacitance Model Generation. At step 274 of FIG. 5, the library analysis process 222 computes an input capacitance model for each input pin of each scalable cell. To account for variances in input pin capacitances between different input pins of a cell, the library analysis process 222 derives, for each input pin, a model for input pin capacitance as a linear function of the scaling size. The scaling sizes and input pin capacitances of all discrete cells corresponding to the scalable cell are used to derive this model. This model is primarily derived to enable load propagation. This model tends to be fairly accurate depending on the performance of the cell clustering processes. Different models are generated for different input pins as they can be significantly different for input pins of complex gates. One example of this is the select and data lines of a multiplexor.

Discretization Process 228

The discretization process 228 of FIG. 2 acts to replace the scalable cells generated by the library analysis process 222 and used by the gain-based structuring and mapping processes 226 with discrete cells of the technology library 204. This is performed because the technology dependent optimizations 230 of FIG. 2 are performed on discrete cells, not the scalable cells. Therefore, at the end of optimization, embodiments of the present invention discretize the scalable cells to the closest discrete cells available in the target technology library 204.

Figure 20:
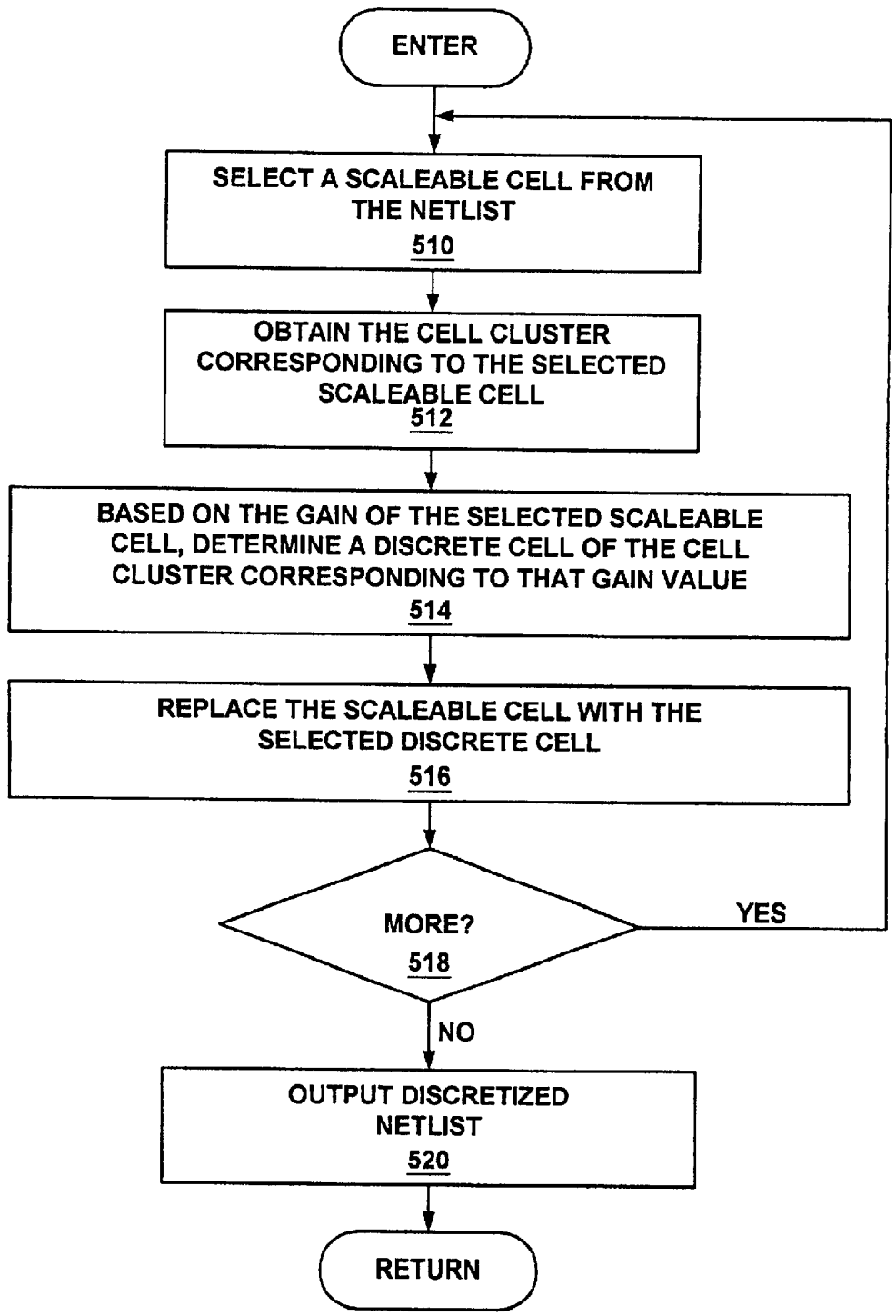
FIG. 20 is a flow diagram of steps of the discretization process in accordance with an embodiment of the present invention.

FIG. 20 illustrates the steps of the discretization process 228 in more detail. At step 510, a particular scalable cell of the input netlist is selected. At step 512, the present invention accesses the cell cluster corresponding to the logic function of the selected scalable cell. At step 514, based on the gain of the selected scalable cell, determine a discrete cell of the selected cell cluster that is closest to the selected scalable cell such that the error in delay between the scalable and discrete cell in minimized and design rule violations like the maximum capacitance and maximum transition rules are addressed. At step 516, the selected scalable cell of the netlist is replaced with the corresponding discrete cell as identified in step 514. At step 518, the above steps are repeated until all scalable cells of the netlist have been replaced with corresponding discrete cells. At step 520, a discretized netlist is then output in memory for used by the technology optimization processes 230 (FIG. 2).

CONCLUSION

The library analysis process 222 creates an internal scalable technology library 224 (FIG. 2) by analyzing discrete cells from the target technology library 204. The scalable cells in the scalable library are characterized with a new load-independent delay model, in which delay is modeled as a non-linear function of gain and slew. In addition, library analysis 222 also creates models for area and load propagation for scalable cells. The optimization processes 226 use the scalable cells (with their gain-based NLDMs) as a basis for optimization. At the end of optimization, discretization process 228 replaces the scalable cells to the closest discrete cells available in the target technology library 204. Following this, technology dependent optimizations 230 are performed primarily for delay, design rule fixing and area recovery.

The accuracy of many processes of FIG. 2 is hinged upon the accuracy of the scalable model that library analysis 222 derives. After performing library analysis, a library analysis process is automatically performed to determine if the target technology library 204 is suitable for the gain-based structuring and mapping processes 226. A library suitability report 212 is generated to aid in this process. If the library 204 is found to be suitable then gain-based structuring and mapping processes 226 are invoked and if not, then traditional logic synthesis processes are performed.

The preferred embodiment of the present invention, a non-linear, gain-based modeling of delay using a scalable cell model, is thus described. While the present invention has been described in particular embodiments, it should be appreciated that the present invention should not be construed as limited by such embodiments, but rather construed according to the below claims.

What is claimed is:

1. A method of generating a scalable cell model for an integrated circuit cell comprising the steps of:
    a) accessing a technology library comprising a plurality of cell groups each cell group comprising a plurality of discrete cells that share a common logic function but are of different cell sizes, each discrete cell having a corresponding output load-based non-linear delay model;
    b) generating a metric for a selected cell group that measures a cell characteristic over all discrete cells of said selected cell group;
    c) generating, based on said metric, a cell cluster for said selected cell group by selecting a subset of discrete cells of said selected cell group that are similar in terms of said cell characteristic;

d) generating a gain-based delay model for said scalable cell model based on output load-based non-linear delay models of said discrete cells of said cell cluster, said gain-based delay model receiving an input gain value and providing, based thereon, an output delay value; and e) storing said gain-based delay model within a computer memory.

2. A method as described in claim 1 further comprising the step of repeating steps b)–e) for each cell group within said technology library.

3. A method as described in claim 2 further comprising the steps of:

accessing an input netlist description of an integrated circuit design;

generating a new netlist by replacing discrete cells of said netlist with scalable cells having associated gain-based delay models;

generating a mapped netlist by performing gain-based structuring and mapping of said new netlist;

generating a discretized netlist by replacing scalable cells of said mapped netlist with corresponding discrete cells of said technology library; and performing technology dependent optimization on said discretized netlist.

4. A method as described in claim 1 wherein said step b) comprises the step of generating a delay consistency metric characterizing delay versus average input capacitance for each discrete cell of said selected cell group.

5. A method as described in claim 1 wherein said step b) comprises the step of generating an input pin capacitance consistency metric characterizing input pin capacitance ratio versus average input capacitance for each discrete cell of said selected cell group.

6. A method as described in claim 1 wherein said step b) comprises the step of generating a slope consistency metric for characterizing said discrete cells of said selected cell group wherein a respective slope value is computed for each discrete cell and is based on a delay versus output load relationship.

7. A method as described in claim 1 wherein said step b) comprises the step of generating an intercept consistency metric for characterizing said discrete cells of said selected cell group wherein a respective intercept value is computed for each discrete cell and is a y-axis intercept of a delay versus output load relationship.

8. A method as described in claim 1 wherein said step b) comprises the step of generating slope-input capacitance metric characterizing an inverse proportion slope versus average input capacitance relationship for said discrete cells of said selected cell group wherein a respective slope is generated for each discrete cell and is based on a delay versus output load relationship.

9. A method as described in claim 1 wherein said step c) comprises the step of selecting said subset of discrete cells of said cell cluster using a scan line cutting process.

10. A method as described in claim 1 wherein said gain-based delay model further receives an input slew value and further provides an output slew value.

11. A method as described in claim 1 further comprising the steps of:

computing a nominal input slew value;

computing a scaling factor for each discrete cell of said cell cluster;

computing a default gain for said scalable cell;

computing an area model for said scalable cell; and computing an input pin capacitance model for each input pin of said scalable cell.

12. A method as described in claim 1 wherein said step d) comprises the steps of:

selecting a particular gain value and a particular input slew value for populating said gain-based delay model;

based on said particular gain value and a particular input slew value, use said output load-based non-linear delay models of said cell cluster to compute a delay values and an output slew values for discrete cells of said cell cluster;

average said delay values and an output slew values of said discrete cells of said cell cluster to produce an average delay value and an average output slew value; and store said average delay value and said average output slew value into said gain-based delay model at a point referenced by said particular gain value and said particular input slew value.

13. A computer system comprising a processor coupled to a bus and a memory unit coupled to said bus and having stored thereon instructions that when executed implement a of method of generating a scalable cell model, said method comprising the steps of:

a) accessing a technology library comprising a plurality of cell groups each cell group comprising a plurality of discrete cells that share a common logic function but are of different cell sizes, each discrete cell having a corresponding output load-based non-linear delay model;

b) generating a metric for a selected cell group that measures a cell characteristic over all discrete cells of said selected cell group;

c) generating, based on said metric, a cell cluster for said selected cell group by selecting a subset of discrete cells of said selected cell group that are similar in terms of said cell characteristic;

d) generating a gain-based delay model for said scalable cell model based on output load-based non-linear delay models of said discrete cells of said cell cluster, said gain-based delay model receiving an input gain value and providing, based thereon, an output delay value; and e) storing said gain-based delay model within a computer memory.

14. A computer system as described in claim 13 wherein said method further comprises the step of repeating steps b)–e) for each cell group within said technology library.

15. A computer system as described in claim 14 wherein said method further comprises the steps of:

accessing an input netlist description of an integrated circuit design;

generating a new netlist by replacing discrete cells of said netlist with scalable cells having associated gain-based delay models;

generating a mapped netlist by performing gain-based structuring and mapping of said new netlist;

generating a discretized netlist by replacing scalable cells of said mapped netlist with corresponding discrete cells of said technology library; and performing technology dependent optimization on said discretized netlist.

16. A computer system as described in claim 13 wherein said step b) comprises the step of generating a delay consistency metric characterizing delay versus average input capacitance for each discrete cell of said selected cell group.

17. A computer system as described in claim 13 wherein said step b) comprises the step of generating an input pin capacitance consistency metric characterizing input pin capacitance ratio versus average input capacitance for each discrete cell of said selected cell group.

18. A computer system as described in claim 13 wherein said step b) comprises the step of generating a slope consistency metric for characterizing said discrete cells of said selected cell group wherein a respective slope value is computed for each discrete cell and is based on a delay versus output load relationship.

19. A computer system as described in claim 13 wherein said step b) comprises the step of generating an intercept consistency metric for characterizing said discrete cells of said selected cell group wherein a respective intercept value is computed for each discrete cell and is a y-axis intercept of a delay versus output load relationship.

20. A computer system as described in claim 13 wherein said step b) comprises the step of generating slope-input capacitance metric characterizing an inverse proportion slope versus average input capacitance relationship for said discrete cells of said selected cell group wherein a respective slope is generated for each discrete cell and is based a delay versus output load relationship.

21. A computer system as described in claim 13 wherein said step c) comprises the step of selecting said subset of discrete cells of said cell cluster using a scan line cutting process.

22. A computer system as described in claim 13 wherein said gain-based delay model further receives an input slew value and further provides an output slew value.

23. A computer system as described in claim 13 wherein said method further comprises the steps of:

computing a nominal input slew value;

computing a scaling factor for each discrete cell of said cell cluster;

computing a default gain for said scalable cell;

computing an area model for said scalable cell; and computing an input pin capacitance model for each input pin of said scalable cell.

24. A computer system as described in claim 13 wherein said step d) comprises the steps of:

selecting a particular gain value and a particular input slew value for populating said gain-based delay model;

based on said particular gain value and a particular input slew value, use said output load-based non-linear delay models of said cell cluster to compute a delay values and an output slew values for discrete cells of said cell cluster;

average said delay values and an output slew values of said discrete cells of said cell cluster to produce an average delay value and an average output slew value; and store said average delay value and said average output slew value into said gain-based delay model at a point referenced by said particular gain value and said particular input slew value.

* * * * *